(12) United States Patent
Van Zyl

(10) Patent No.: US 12,237,778 B2
(45) Date of Patent: Feb. 25, 2025

(54) INPUT IMPEDANCE NETWORKS WITH POWER RECOVERY

(71) Applicant: Advanced Energy Industries, Inc., Denver, CO (US)

(72) Inventor: Gideon Van Zyl, Fort Collins, CO (US)

(73) Assignee: Advanced Energy Industries, Inc., Denver, CO (US)

(*) Notice: Subject to any disclaimer, the term of this patent is extended or adjusted under 35 U.S.C. 154(b) by 0 days.

(21) Appl. No.: 18/411,325

(22) Filed: Jan. 12, 2024

(65) Prior Publication Data

US 2024/0154541 A1    May 9, 2024

Related U.S. Application Data

(63) Continuation of application No. 17/229,353, filed on Apr. 13, 2021, now Pat. No. 11,876,460.
(Continued)

(51) Int. Cl.
| | |
|---|---|
| *H03H 7/52* | (2006.01) |
| *H01J 37/32* | (2006.01) |
| *H02M 1/00* | (2007.01) |
| *H02M 7/537* | (2006.01) |
| *H03H 7/38* | (2006.01) |

(52) U.S. Cl.
CPC ....... *H02M 7/537* (2013.01); *H01J 37/32183* (2013.01); *H02M 1/0009* (2021.05); *H03H 7/38* (2013.01); *H03H 7/52* (2013.01)

(58) Field of Classification Search
CPC . H01P 1/22; H03G 11/02; H02J 3/381; H03H 7/40; H03H 7/38; H03H 7/52; H03H 7/48; H03H 7/463; H03H 7/46; H03H 5/12; H05H 1/46
See application file for complete search history.

(56) References Cited

U.S. PATENT DOCUMENTS

| | | |
|---|---|---|
| 5,606,284 A | 2/1997 | Tamesue et al. |
| 6,469,919 B1 | 10/2002 | Bennett |

(Continued)

FOREIGN PATENT DOCUMENTS

| | | |
|---|---|---|
| CN | 106341925 A | 1/2017 |
| CN | 208316381 U | 1/2019 |

(Continued)

OTHER PUBLICATIONS

EPO, The extended European search report issued in Application No. 21788901.3, Mar. 19, 2024, 7 pages.
(Continued)

*Primary Examiner* — John W Poos
(74) *Attorney, Agent, or Firm* — Neugeboren O'Dowd PC

(57) ABSTRACT

Input impedance networks and associated methods are disclosed. An input impedance network comprises a source-terminal-pair configured to couple to a power source, a recovered-power-terminal-pair configured to couple to a power sink, a transmission line coupled to the source-terminal-pair that comprises M sections, and N clamping circuits. Each of the N clamping circuits is configured to clamp at least one of voltage or current in one of the M sections, and a power recovery circuit is coupled to the N clamping circuits to enable recovered energy to be applied to the recovered-power-terminal-pair.

19 Claims, 30 Drawing Sheets

Related U.S. Application Data

(60) Provisional application No. 63/009,049, filed on Apr. 13, 2020.

(56) References Cited

U.S. PATENT DOCUMENTS

| | | | |
|---|---|---|---|
| 8,929,107 B2 | 1/2015 | Kang et al. | |
| 9,019,669 B1 | 4/2015 | Ransijn | |
| 10,148,188 B2 | 12/2018 | Koo et al. | |
| 10,404,242 B1* | 9/2019 | Lappe | H03G 11/02 |
| 10,587,206 B1 | 3/2020 | Xiao et al. | |
| 2002/0180552 A1* | 12/2002 | Bennett | H03G 11/02 |
| | | | 327/309 |
| 2006/0139823 A1 | 6/2006 | Shoji et al. | |
| 2007/0035408 A1 | 2/2007 | Roberts et al. | |
| 2008/0074909 A1* | 3/2008 | Mehta | H05B 41/2853 |
| | | | 363/52 |
| 2010/0283395 A1 | 11/2010 | Van Zyl et al. | |
| 2011/0101898 A1 | 5/2011 | Shinomoto et al. | |
| 2012/0218668 A1 | 8/2012 | Kidger et al. | |
| 2012/0235504 A1 | 9/2012 | Kesler et al. | |
| 2013/0207738 A1* | 8/2013 | Mason | H03H 11/28 |
| | | | 333/32 |
| 2014/0210508 A1 | 7/2014 | Valcore, Jr. et al. | |
| 2015/0263511 A1 | 9/2015 | Sandner et al. | |
| 2016/0380425 A1 | 12/2016 | Chapman | |
| 2018/0006448 A1 | 1/2018 | Glaser | |
| 2019/0131940 A1 | 5/2019 | Moise et al. | |
| 2019/0273496 A1 | 9/2019 | van Zyl | |
| 2019/0348992 A1 | 11/2019 | Van Zyl | |
| 2020/0212869 A1 | 7/2020 | Morii | |
| 2021/0320594 A1 | 10/2021 | Van Zyl | |
| 2022/0329169 A1 | 10/2022 | Van Zyl | |
| 2022/0329170 A1 | 10/2022 | Van Zyl | |

FOREIGN PATENT DOCUMENTS

| | | |
|---|---|---|
| EP | 3197013 A1 | 7/2017 |
| EP | 3514907 A1 | 7/2019 |
| JP | H0767318 A | 3/1995 |
| JP | 2021035205 A | 3/2021 |
| WO | 2010013344 A1 | 2/2010 |
| WO | 2010064284 A1 | 6/2010 |
| WO | 2021211582 A1 | 10/2021 |
| WO | 2022155837 A1 | 7/2022 |

OTHER PUBLICATIONS

Fiona Doherty, "International Preliminary Report on Patentability issued in Application No. PCT/US2021/027081", dated Oct. 13, 2022, pp. 12, Published in: Switzerland.

ISA/KR, "International Search Report and Written Opinion Regarding International Application No. PCT/US2022/020515", dated Jul. 14, 2022, pp. 9, Published in: KR.

Jang, Gi Jeong, "International Search Report and Written Opinion Regarding Application No. PCT/US2022/053313", dated May 3, 2023, p. 10, Published in: KR.

Rodriquez, Kari, "International Search Report and Written Opinion Regarding International Application No. PCT/US21/27081", dated Jul. 27, 2021, pp. 19, Published in: US.

TIPO, Office Action issued in TW Application No. 110113252, Nov. 5, 2024, 21 pages.

\* cited by examiner

Current Clamping Circuits

Current Amplitude Measurement Circuit

FIG. 11F Voltage Amplitude Measurement Circuit

FIG. 11D Voltage Clamping Circuits

INPUT IMPEDANCE NETWORKS WITH POWER RECOVERY

CLAIM OF PRIORITY UNDER 35 U.S.C. § 119

The present application for patent is a continuation of U.S. patent application Ser. No. 17/229,353 entitled "INPUT IMPEDANCE NETWORKS WITH POWER RECOVERY" filed Apr. 13, 2021 which claims priority to Provisional Application No. 63/009,049 entitled "Input Impedance Network with Power Recovery" filed Apr. 13, 2020, and assigned to the assignee hereof and hereby expressly incorporated by reference herein.

BACKGROUND

Field

The present disclosed embodiments relate generally to electrical power, and more specifically to input impedance networks.

Background

It is relatively easy to design a power source to deliver power into a known load (e.g. 50Ω). In the context of a plasma load, the plasma load impedance can change based on applied power, gas properties etc. Thus, generators (e.g., RF generators) applying power to a plasma load (e.g., to ignite and sustain a plasma) need to deliver power into varying impedances.

In addition, generator-plasma system instability can result because of changing plasma impedance due to the changing power into the plasma system. Moreover, modulation of plasma loads by other sources cause significant power to be reflected back at the generator. This results in generators having to be significantly over-designed to deal with the problem.

SUMMARY

An aspect may be characterized as an input impedance network that comprises a source-terminal-pair configured to couple to a power source, a recovered-power-terminal-pair configured to couple to a power sink, a transmission line coupled to the source-terminal-pair that comprises M sections, and N clamping circuits configured to clamp at least one of voltage or current in one of the M sections. The input impedance network also comprises a power recovery circuit coupled to the N clamping circuits, the power recovery circuit using energy recovered from the clamping circuits to apply power to the recovered-power-terminal-pair.

Another aspect may be characterized as a power system comprising a power source and an input impedance network coupled to the power source. The input impedance network comprises a transmission line comprising M sections and a distributed-clamping circuit configured to clamp at least one of voltage or current in N of the M sections. The power system also includes a power recovery circuit to apply power to a power sink using energy recovered from the distributed-clamping circuit.

Yet another aspect may be characterized as a power system comprising a power source and an input impedance network coupled to the power source. The input impedance network comprises means for providing a substantially constant impedance to the power source and a power recovery circuit coupled to the power source to apply power to a power sink using energy recovered from the means for providing a substantially constant impedance.

BRIEF DESCRIPTION OF THE DRAWINGS

FIGS. 11A-11F are schematics depicting another example of an input impedance network;

DETAILED DESCRIPTION

Figure 1A:
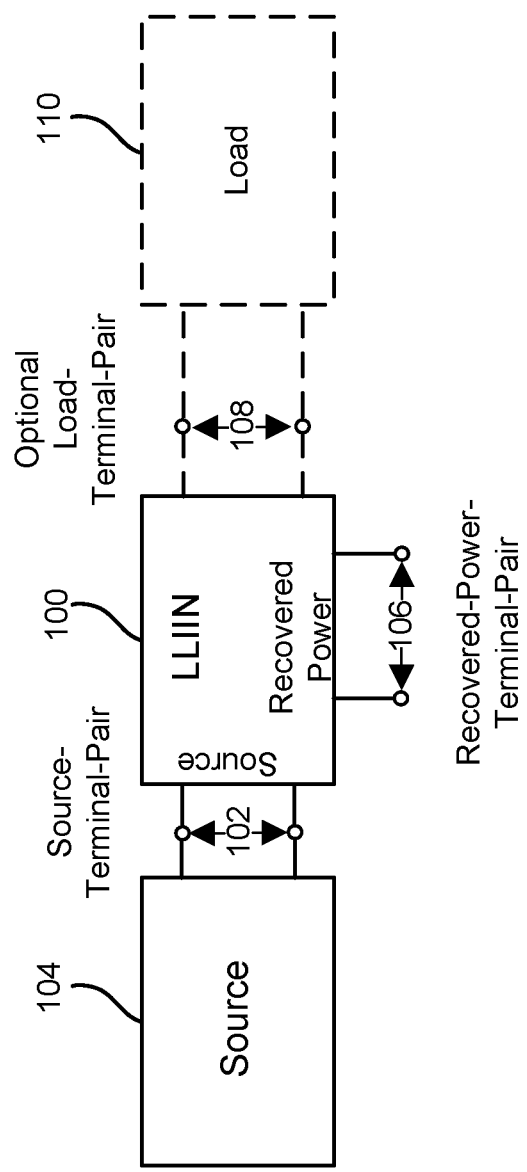
FIG. 1A is a block diagram depicting a power system including an input impedance network.

All of the problems listed above can be solved or significantly reduced in severity by placing a circulator between a generator and the plasma. However, circulators at low frequency (e.g., below 60 MHz) are bulky, expensive, and generally difficult to construct. In addition, when a circulator is used, reflected power is typically dissipated as heat in a dump load.

Lorentz reciprocity makes it clear that to construct a circuit with the properties of a circulator, either non-isotropic media (such a ferrite subjected to a direct current (DC) magnetic field or plasma) is needed, nonlinear components are needed, and/or time varying components are needed.

Various circuits constructed entirely of isotropic media (and thus containing nonlinear or time-varying components) with circulator-like properties have been proposed, but these circuits are unsuitable for low frequency high power applications in which significant incident power is reflected back from the load.

Among many circuit variations described herein, the present disclosure describes a class of circuits that have circulator-like properties in which a source sees nearly constant impedance irrespective of the load impedance and in which, substantially all power delivered to a circuit that is not delivered to a load is recovered. The word "exemplary" in the present disclosure is used herein to mean "serving as an example, instance, or illustration." Any embodiment described herein as "exemplary" is not necessarily to be construed as preferred or advantageous over other embodiments.

To better understand the various circuits described herein, it is helpful to understand issues with coupling power from a source to a load with a transmission line. If the transmission line is a lossless transmission line (or its lumped element equivalent) connected between a source of RF power and a load, and if the load impedance is matched to the characteristic impedance of the transmission line, the amplitude of the voltage and current along the line is constant. But if the load impedance is different from the characteristic impedance of the transmission line, standing waves form along the length of the transmission line and the amplitude of the voltage and current change along the length of the transmission line.

Applicant has found that if a transmission line that is a quarter wavelength long (at the frequency of the applied power) is divided into sections, a distributed-voltage-clamping circuit that includes, at the interface of each section, a voltage clamp that clamps the peak voltage magnitude to the amplitude of the voltage produced at the source side of the transmission line, a portion of the problems described above is essentially solved—provided a sufficient number of sections are used. More specifically, such a distributed-voltage-clamping circuit provides an almost constant impedance to the generator if the load impedance is resistive and larger than the real part of the characteristic impedance of the transmission line. (The characteristic impedance of a lossy transmission line can be complex, but for low loss transmission lines the real part is generally significantly larger than the magnitude of the imaginary part and the imaginary part can generally be ignored.) The power taken from the voltage clamps in this case is substantially equal to a part of the power supplied by the source that is not delivered to the load, so in that sense, the distributed-voltage-clamping circuit is substantially lossless. If the transmission line is open circuited on the load side for example, a distributed-voltage-clamping circuit can provide an impedance to the source that is substantially equal to the characteristic impedance of the transmission line. Similarly, a half-wavelength long transmission line provides an almost constant impedance to the generator if the load is resistive and smaller than the real part of the characteristic impedance of the transmission line. If a half wavelength long line is short circuited on the load side for example, a distributed-voltage-clamping circuit can provide an impedance to the source that is substantially equal to the characteristic impedance of the transmission line.

The distributed-voltage-clamping circuit, however, ceases to work in the same way if, e.g., the line is a quarter wavelength long, the load is resistive and the load resistance is smaller than the real part of the characteristic impedance of the transmission line. More specifically, voltage amplitude will be largest at the source, and smaller everywhere else along the transmission line. In this case, the distributed-voltage-clamping circuit described above does substantially nothing and the impedance seen by the source is equal to the load impedance transformed by the transmission line. Similarly, a half-wavelength long voltage-clamped transmission line fails to provide a substantially constant impedance to a source if the load is resistive and the load resistance is larger than the real part of the characteristic impedance of the transmission line. In this case, the voltage is highest at the source and load ends of the transmission line and the voltage-clamping circuit does substantially nothing.

Continuing with the case of a quarter wavelength long transmission line where the load is resistive and the load resistance is smaller than the real part of the characteristic impedance of the transmission line, current is minimum at the source end of the transmission line and higher everywhere else along the length of the transmission line. In this case, the standing wave along the length of the line can be suppressed by limiting the current along the length of the line to the current at the source side of the line. For example, the transmission line may be divided into sections, and a distributed-current-clamping circuit that includes, at the interface of each section, a current clamp may be used. Each current clamp may clamp the peak current magnitude to the amplitude of the current at the source side of the transmission line. Beneficially in many implementations nothing need be done at the source end of the transmission line.

If both the distributed-voltage-clamp and distributed-current-clamp techniques (generally referred to as distributed-clamping circuits) are combined, the impedance that the source sees may be limited to very small excursions from the characteristic impedance of the line irrespective of the load impedance. And in addition, several clamping circuits disclosed herein enable any power delivered by the source that is not delivered to the load to be recovered from the clamping circuits resulting in a substantially lossless circuit.

In addition to providing an almost constant impedance to a source of RF power (e.g. the power amplifier (PA) of a RF generator), the fraction of power delivered to the load as a function of load reflection coefficient magnitude (when the source delivers constant power) is very close to (1−x) where x is the load reflection coefficient magnitude. For values of x around 0.5 this matches the standard power profile required of industrial generators used in semiconductor applications. For low values of x, power to the load decreases immediately instead of remaining approximately constant until x is around 0.2. This can be remedied by clamping voltage and current slightly above the values at the source side of the circuit, but this does allow more change in the impedance seen by the source.

An aspect of many, but not all, of the circuit variations described herein is the capability to provide both: a substantially constant impedance to a source of power (e.g., RF power) and power recovery for a substantial fraction of power delivered by the source that is not delivered to the load. In an ideal case where the circuits are constructed of lossless components (e.g., diodes with zero voltage drop, lossless switches, and lossless passive components), and in which an infinite number of transmission line sections are used, the circuits are indeed lossless and provide a substantially constant impedance to the source. In the real world, a substantial portion, but not all, of the power delivered by the source that is not delivered to the load is recovered and the impedance seen by the source changes somewhat if the load impedance is changed. In what follows a circuit of the type described here is referred to as a Low Loss Input Impedance Network (LLIIN).

Figure 1B:
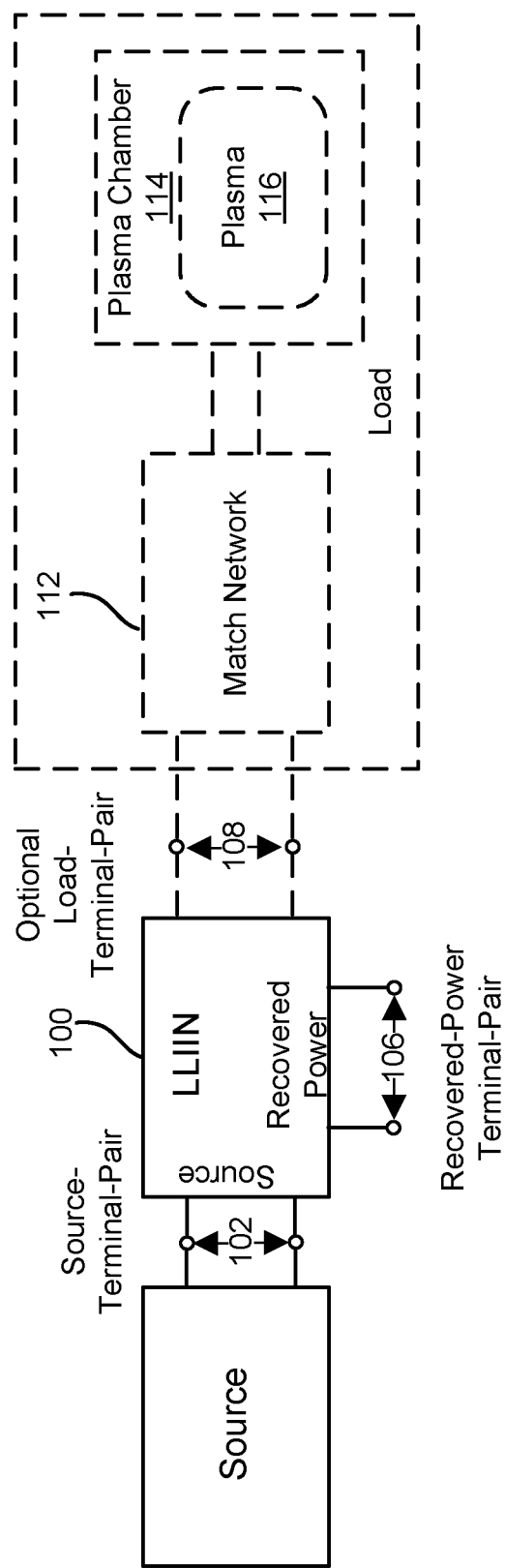
FIG. 1B is a block diagram depicting a power system where the load depicted in FIG. 1A comprises a match network and a plasma in a plasma chamber.

Referring first to FIGS. 1A and 1B, shown are exemplary environments comprising power systems in which several implementations of a LLIIN 100 may be utilized. As shown, the LLIIN 100 includes a source-terminal-pair 102 that is configured to couple to a source 104, a recovered-power-terminal-pair 106 that is configured to couple to a power sink (not shown in FIGS. 1A and 1B), and an optional load-terminal-pair 108 that may couple to an optional load 110. It should be recognized that the LLIIN 100 may be made and sold as a distinct, separate apparatus from the source 104, optional load 110, and power sink. It is also contemplated that the LLIIN 100 may optionally be integrated with a source and power sink to form a unitary device as discussed further herein. As shown in FIG. 1B, the optional load 110 may include a match network 112 that is coupled to a plasma chamber 114 that is configured to contain a plasma 116.

Many variations of the LLIIN 100 operate to provide a nearly constant load impedance to the source 104 while applying power to the recovered-power-terminal-pair 106 to enable energy to be recovered (e.g., to do work) as opposed to being dissipated as heat (e.g., via a dump resistor). Some variations of the LLIIN 100 allow the impedance seen by the source 104 to vary while protecting the source from damaging power conditions such as high voltage and/or high current conditions, and in these variations, power may also be recovered and applied to the recovered-power-terminal-pair 106.

The LLIIN 100 may include a transmission line that is divided into M sections, and a distributed-voltage-clamping circuit and/or a distributed-current-clamping circuit may clamp the voltage and/or current at the interface of each section. In many implementations, a total length of the transmission line is a quarter-wavelength or a half-wavelength of the power applied to the transmission line. If the source 104 is capable of providing a range of frequencies (and hence a range of wavelengths), the total length of the transmission line may be at least a quarter-wavelength of a lowest frequency of the power applied by the source 104. The sections of the divisions of the transmission line may be equal length, but this is not required, and in some implementations, the length of each section is not the same.

If a distributed-voltage-clamping circuit is utilized, in many implementations, a voltage at each section may be clamped to a voltage applied by the source. But it is also contemplated that the voltage at each section may be clamped to a fixed voltage. If a distributed-current-clamping circuit is utilized, in many implementations, current at each section may be clamped to a current level provided by the source. But it is also contemplated that the current at each section may be clamped to a fixed current.

The source 104 is generally an electric power source that may be realized, for example, by a generator or the isolation port of a circulator that is part of a larger system. When realized by a generator, the generator may be capable of applying a range of frequencies. In many implementations, the generator may apply power with frequencies greater than 100 kHz, and in yet other implementations, the LLIIN is particularly useful at frequencies less than 100 MHz. where circulators are difficult to implement. But it is also contemplated that generators that operate at much lower frequencies (such as 5 kHz) or much higher frequencies (such as 5 GHz) may be utilized.

In some applications, the LLIIN 100 is not coupled to a load at all (e.g., the load-terminal-pair is removed by short circuiting the load-terminal-pair internal to the LLIIN). In other applications, such as is described with reference to FIGS. 2, 3, and 4 the LLIIN may be coupled to fixed or a dynamic, non-linear load, e.g., a plasma load (as shown in FIG. 1B).

Figure 2:
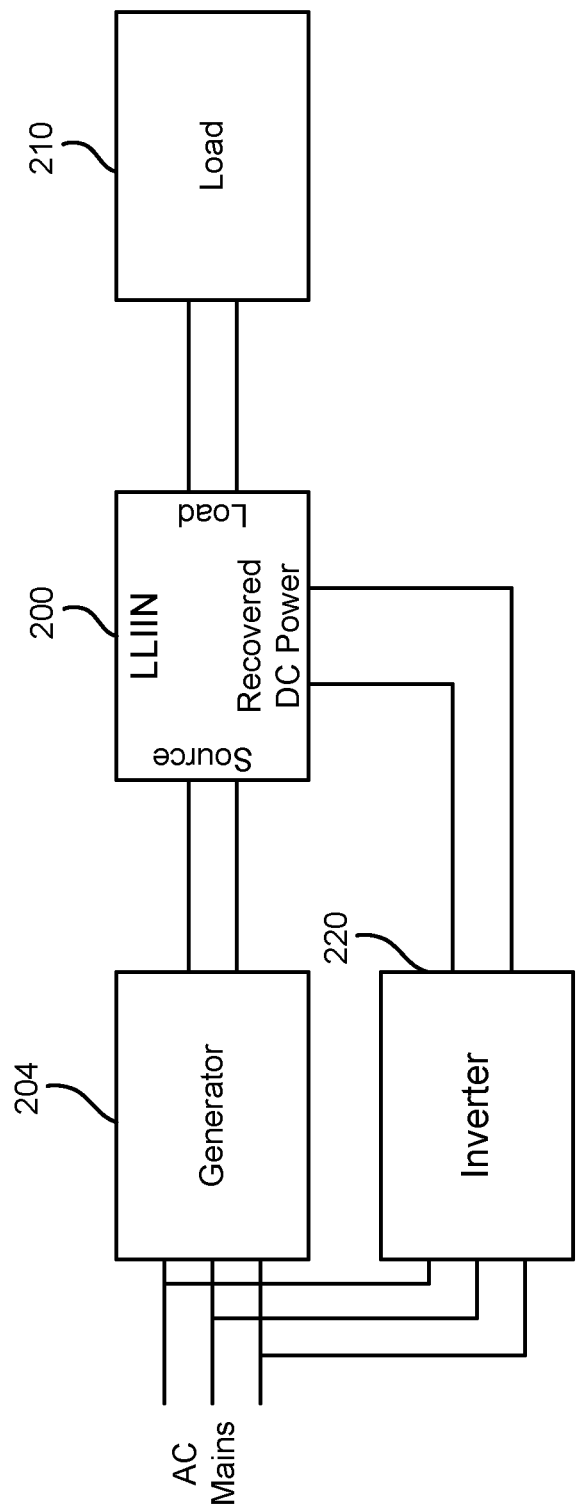
FIG. 2 is a block diagram depicting a system wherein an input impedance network recovers power and applies power to a generator via an inverter.

Referring to FIG. 2, shown is a LLIIN 200 (which may be used to realize the LLIIN 100) that is positioned to couple power from the source to a load 210 where the source is a generator 204. Beneficially, the LLIIN 200 also enables the application of power from the generator 204 to the load 210 in a substantially lossless manner. More specifically, power from the generator 204 that is not effectively applied to the load 210 is recovered by the LLIIN 200. In the implementation depicted in FIG. 2, power that is not applied to the load 210 is recovered as direct current (DC) power that is applied to an inverter 220, which in turn, converts the DC power to AC power that is applied to AC mains that couple to an AC input of the generator 204. In FIG. 2, the inverter 220 is depicted as a separate component, but the inverter 220 may be included as part of the LLIIN 200 (e.g., within the same housing and/or the same circuit board as the LLIIN 200).

Figure 3:
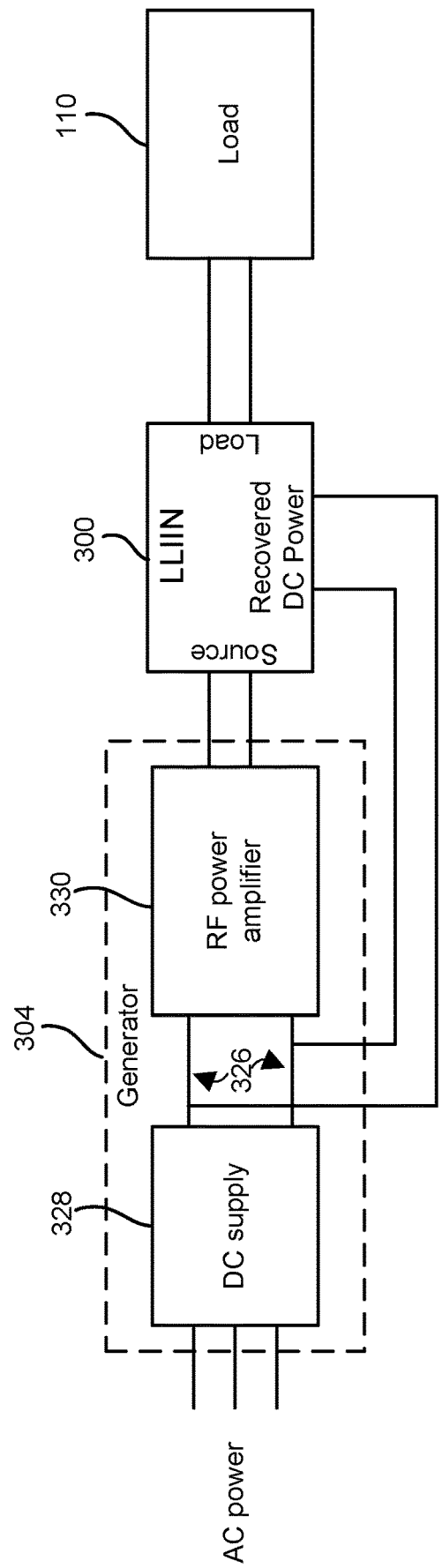
FIG. 3 is a block diagram depicting a system wherein an input impedance network recovers power and applies power to a DC bus of a generator.

As shown in FIG. 3, a LLIIN 300 (which may be used to realize the LLIIN 100) may be configured to apply DC power to a DC bus 326 that couples DC power from a DC supply 328 (within a generator 304) to a power amplifier 330 (e.g., an RF power amplifier 330 within the generator 304).

In operation, the LLIIN 300 converts recovered power to a level that is applied across the DC bus 326. The LLIIN 300 depicted in FIG. 3 may be the same as the LLIIN 200 in FIG. 2 except that the recovered DC power that is output by the LLIIN 200 in FIG. 2 need not apply a DC voltage level that matches the voltage level that is applied across the DC bus 326. In the implementations depicted in FIGS. 2 and 3, the LLIINs 200, 300 include a transmission line that couples the source (implemented as a generator) to the load.

Figure 4:
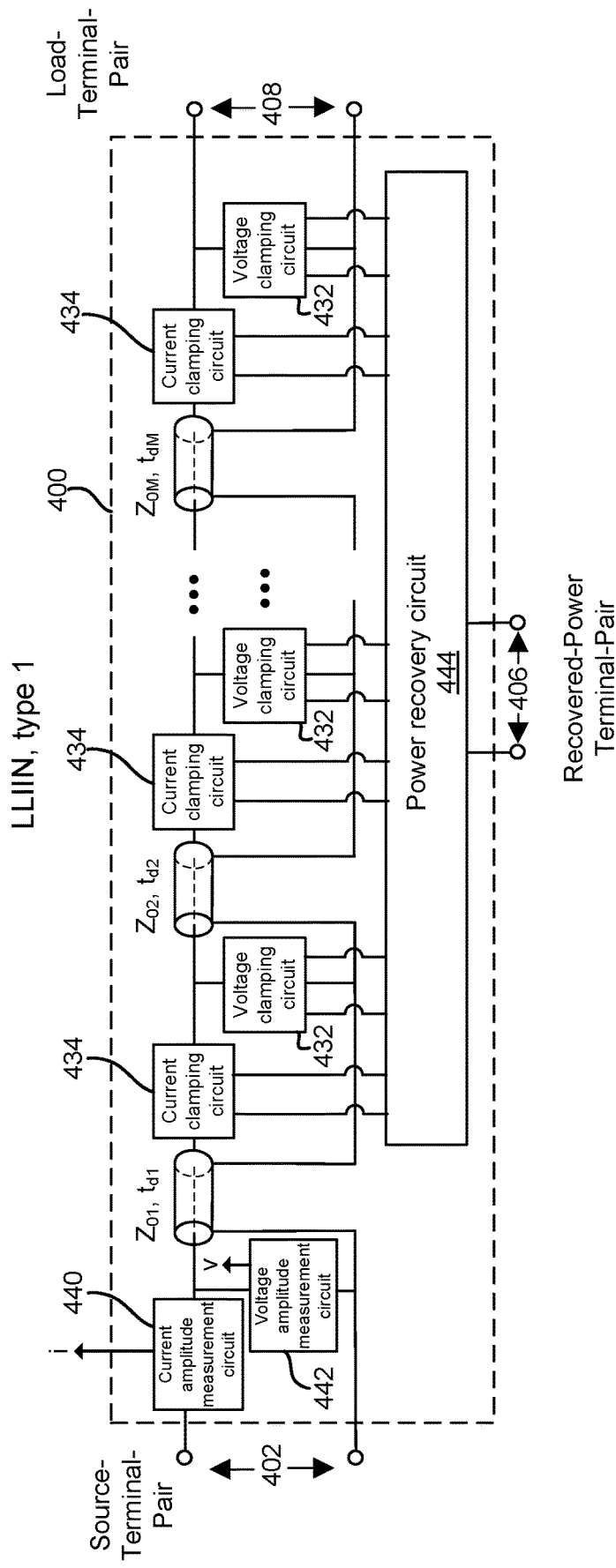
FIG. 4 is a diagram depicting an example of an input impedance network.

Referring to FIG. 4, shown is an exemplary LLIIN that may be implemented to realize the LLIINs 200, 300 depicted in FIGS. 2 and 3. As shown, the LLIIN 400 includes a transmission line that includes a source-terminal-pair 402 configured to couple to a source and a load-terminal-pair 408 configured to couple to a load. It is also contemplated that the load-terminal pair may be short circuited or left open circuited in some applications.

As depicted, the transmission line is sectioned into M sections, where M is equal to two or more, and each of the M sections is voltage clamped by a voltage clamping circuit 432 and current clamped by a current clamping circuit 434. The transmission line is characterized by a characteristic impedance ($Z_{01}$ through $Z_{0M}$) and an electrical delay ($t_{d1}$ through $t_{dM}$). Electrical length is related to electrical delay for RF power at a frequency f such that an electrical length of a quarter wavelength corresponds to a delay equal to one quarter of a period (1/f) of the RF power. Collectively there are M voltage clamping circuits 432 (forming a distributed-voltage-clamping circuit) and M current clamping circuits 434 (forming a distributed-current-clamping circuit). In some applications there may be more voltage clamping circuits than current clamping circuits or more current clamping circuits 434 than voltage clamping circuits 432. A current amplitude measurement circuit 440 is positioned along one of the conductors of the transmission line on the generator side (source-terminal-pair side) and a voltage amplitude measurement circuit 442 is positioned across the source-terminal-pair 402. Alternatively, rather than using a current amplitude measurement circuit 440 and voltage amplitude measurement circuit 442, the amplitude of the voltage and current may be obtained through a coupler (e.g., directional coupler) or VI sensor based measurement system to enable control of the distributed-clamping circuit. In some applications, the current clamping circuits 434 clamp the peak current magnitude in each section to a level of current equal to, or equal to some value proportional to, the amplitude of the current at the generator side of the transmission line as measured by the current amplitude measurement circuit 440. In some applications the voltage clamping circuits 432 clamp the peak voltage magnitude in each section to a level of voltage equal to, or equal to some value proportional to, the amplitude of the voltage at the generator side of the transmission line as measured by the voltage amplitude measurement circuit. The transmission line may be sections of, e.g., a coaxial transmission line or equivalent lumped circuits.

Each of the M sections may be an equal length so that an impedance and delay of each section may be the same. But it is contemplated that the impedance and delay of each section need not be the same. In many implementations, the total delay of the M sections is greater than or equal to a quarter of a period of a lowest frequency of the generator.

A length of each of the sections can be adapted to be suitable for the frequency of the power that is applied by the generator. In an exemplary implementation, it was found that eight (M=8) sections in which each section has an electrical delay equal to either $\frac{1}{32}$ of the period of the applied power (for a total delay of one quarter of a period of the applied power) or $\frac{1}{16}$ of the period of the applied power (for a total delay of one half of a period of the applied power) resulted in acceptable performance of the LLIIN 400. The desired impedance may be 50 ohms, but it is contemplated that other impedance values may be desired for each section.

In operation, the current amplitude measurement circuit 440 provides an output indicative of a level of current at a source side of the transmission line and the voltage amplitude measurement circuit 442 provides an output indicative of a level of voltage across the source-terminal-pair at a source side of the transmission line. In response to the measured current and voltage, each of the current clamping circuits 434 may be controlled to clamp a level of current at interfaces between the M sections to the level of current at a source side of the transmission line and each of the voltage clamping circuits 432 may be controlled to clamp a level of voltage across each of the M sections to the level of voltage across the source-terminal-pair 402 at the source side of the transmission line.

When operated in this way, the LLIIN 400 limits the impedance that the generator sees to very small excursions from the characteristic impedance of the transmission line irrespective of the load impedance, and furthermore, power delivered by the generator that is not delivered to the load can be recovered from the voltage clamping circuits 432 and/or current clamping circuits 434 with a power recovery circuit 444. The power recovery circuit 444 is coupled to the M clamping circuits, and the power recovery circuit 444 is configured to use energy recovered from the clamping circuits to apply power to the recovered-power-terminal-pair 406.

Figure 5:
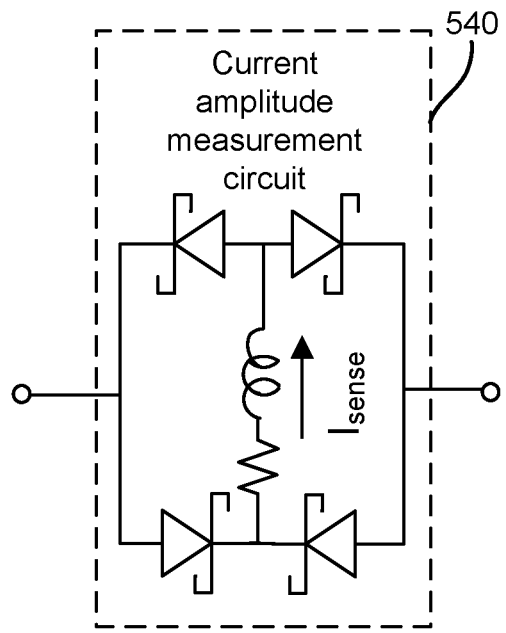
FIG. 5 is a schematic depicting an example of a current amplitude measurement circuit.
Figure 6:
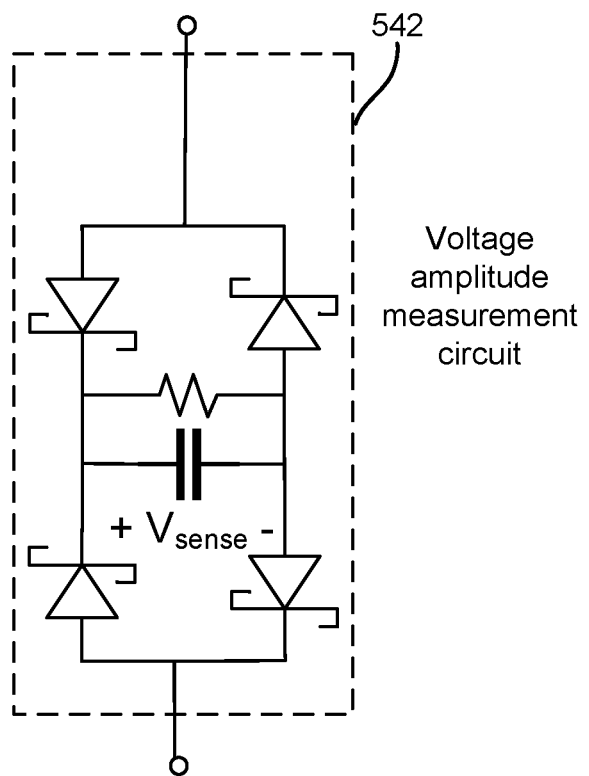
FIG. 6 is a schematic depicting an example of a voltage amplitude measurement circuit.

Referring to FIG. 5, shown is an exemplary current amplitude measurement circuit 540 that may be used to realize the current amplitude measurement circuits 440 depicted in FIG. 4. As shown, the current amplitude measurement circuit may comprise a current path for the sensed current, Isense, comprising a series arrangement of resistive and inductive elements between nodes of a full diode bridge. And FIG. 6 is an exemplary voltage amplitude measurement circuit 542 that may be used to realize the voltage amplitude measurement circuits 442 depicted in FIG. 4. As shown, a potential difference, Vsense, is set up across a capacitor that is arranged in parallel with a resistive element, and the parallel combination of the capacitor and resistive element is positioned between two nodes of a diode bridge.

Figure 7:
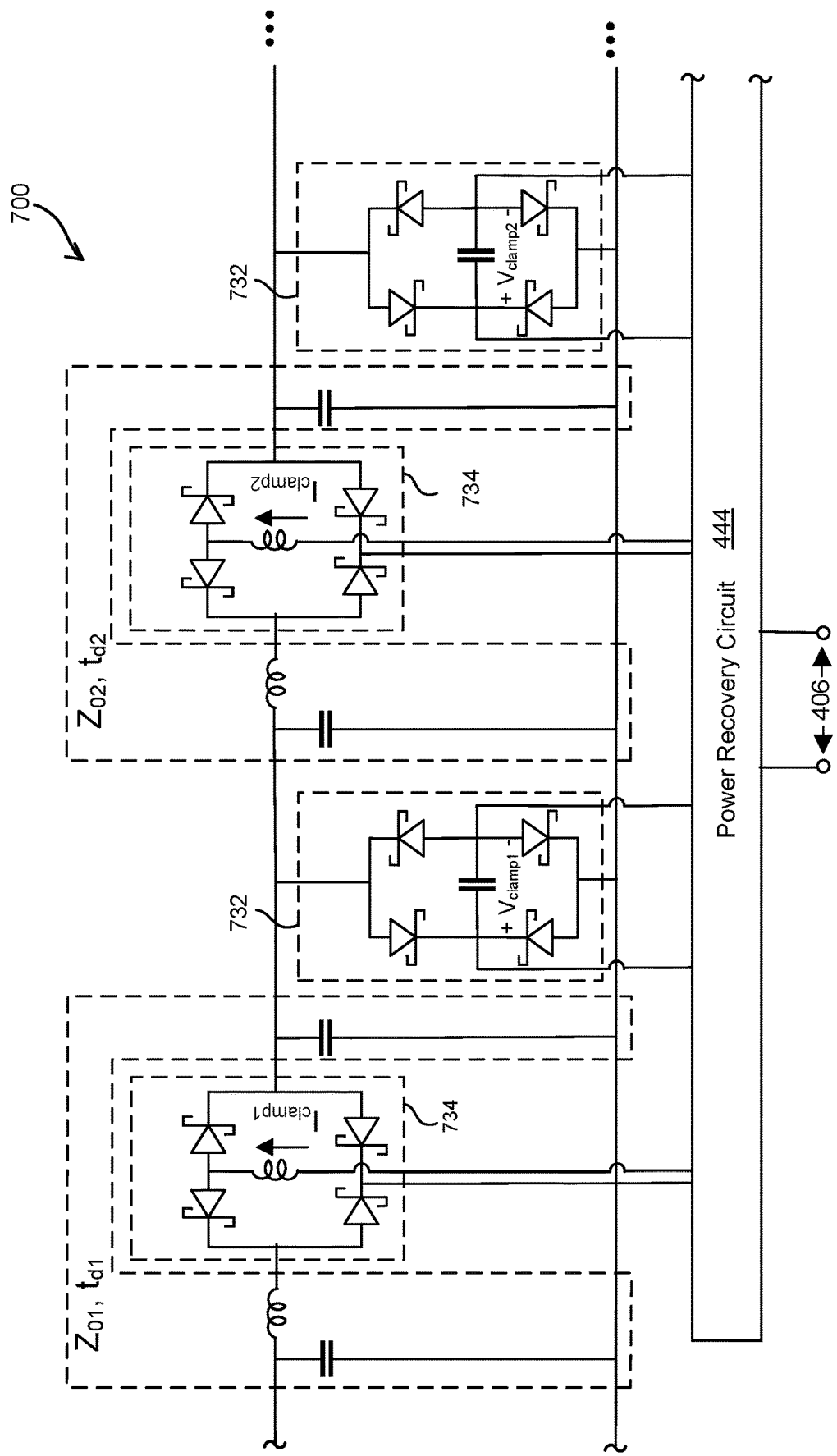
FIG. 7 is a schematic depicting aspects of an input impedance circuit.

FIG. 7 depicts a portion of a LLIIN 700 that may be used to implement the LLIIN 400 depicted in FIG. 4. In particular, FIG. 7 depicts particular implementations for the current clamping circuits 734 and the voltage clamping circuits 732. As shown, each current clamping circuit 734 includes a current path, IclampM, between nodes of a full diode bridge that feeds through the power recovery circuit 444, which enables the current through each current clamping circuit 734 to be controlled. And each voltage clamping circuit 732 includes a capacitor positioned between nodes of a full diode bridge to enable a voltage, VclampM, to be controlled by the power recovery circuit 444. As a consequence, the voltage of each of the M sections may be controlled. More specifically, the voltage amplitude of a section of the transmission line is the voltage, VclampM, plus two diode voltage drops. Although M clamping circuits are utilized to clamp the voltage and or current of M transmission line sections, it is also contemplated that N clamping circuits may be utilized where N is less than M. For example, a viable input impedance network may be constructed with less than all of the M sections being clamped. As examples, N may be equal to M minus one, or N may be equal to M minus two, but these are merely examples.

Figure 8:
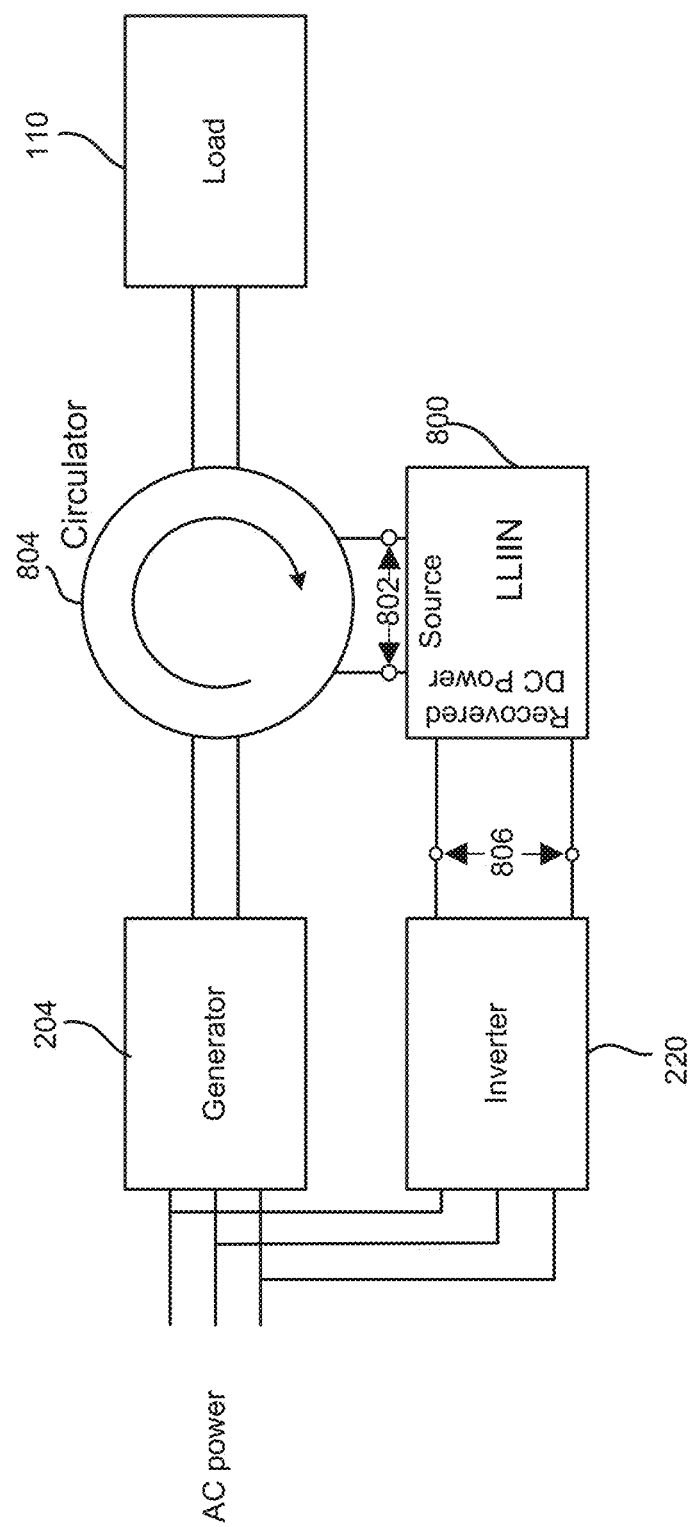
FIG. 8 is a diagram depicting a system comprising an input impedance network coupled utilized in connection with a circulator.

Referring to FIG. 8, shown is a LLIIN 800 where the source-terminal-pair 802 of the LLIIN 800 is coupled to a circulator 804 to replace a dump resistor that would typically be coupled to a dump port (isolation port) of the circulator 804. Power that would ordinarily be dissipated as heat in the dump resistor is instead recovered as DC power at a recovered-power-terminal-pair 806 of the LLIIN 800 and fed to an inverter 220, which in turn, converts the DC power to AC power that is applied to AC mains. The DC to AC inverter may also be part of the LLIIN 800.

Figure 9:
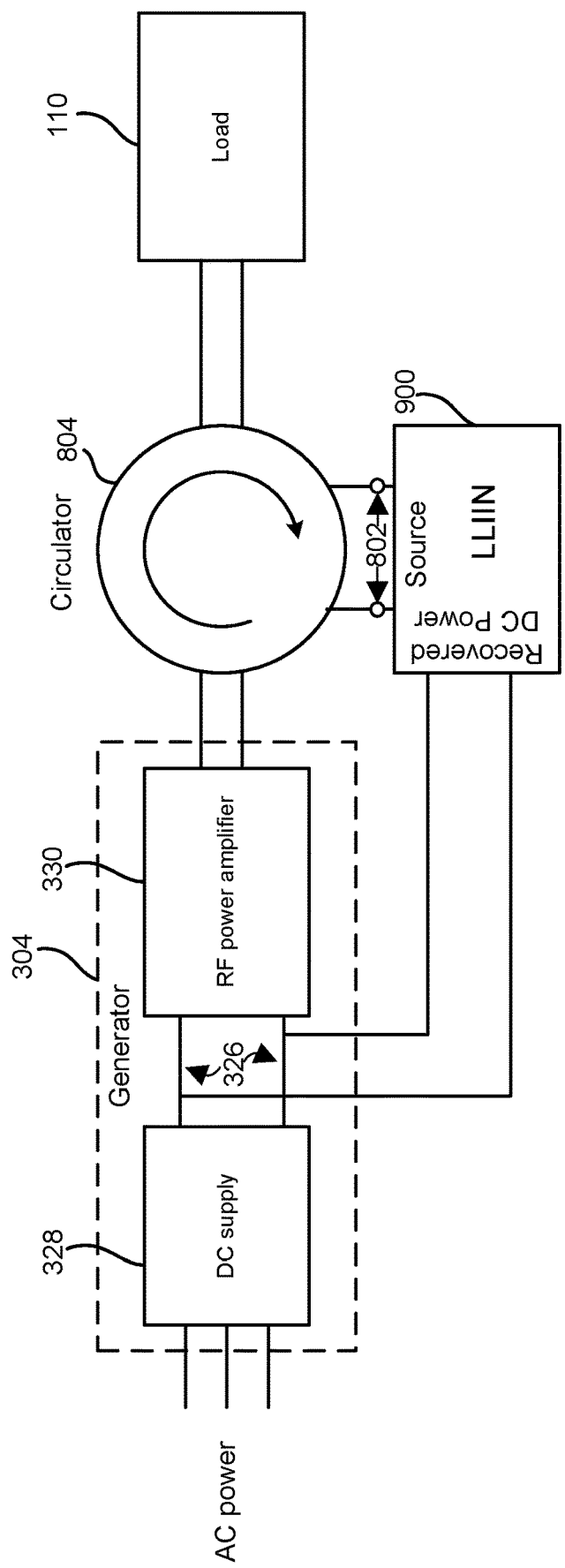
FIG. 9 is a diagram depicting another system comprising an input impedance network utilized in connection with a circulator.

As shown in FIG. 9, a LLIIN 900 (which may be used to realize the LLIIN 100) may be configured to apply DC power to the DC bus 326 that couples DC power from the DC supply 328 (within the generator 304) to the power amplifier 330 (e.g., an RF power amplifier 330 within the generator). In operation, the LLIIN 900 converts recovered power from the circulator 804 to a level that is applied across the DC bus 326. The LLIIN 900 depicted in FIG. 9 may be the same as the LLIIN 800 in FIG. 8 except that the recovered DC power that is output by the LLIIN 800 in FIG. 8 need not apply a DC voltage level that matches the voltage level that is applied across the DC bus.

Figure 10:
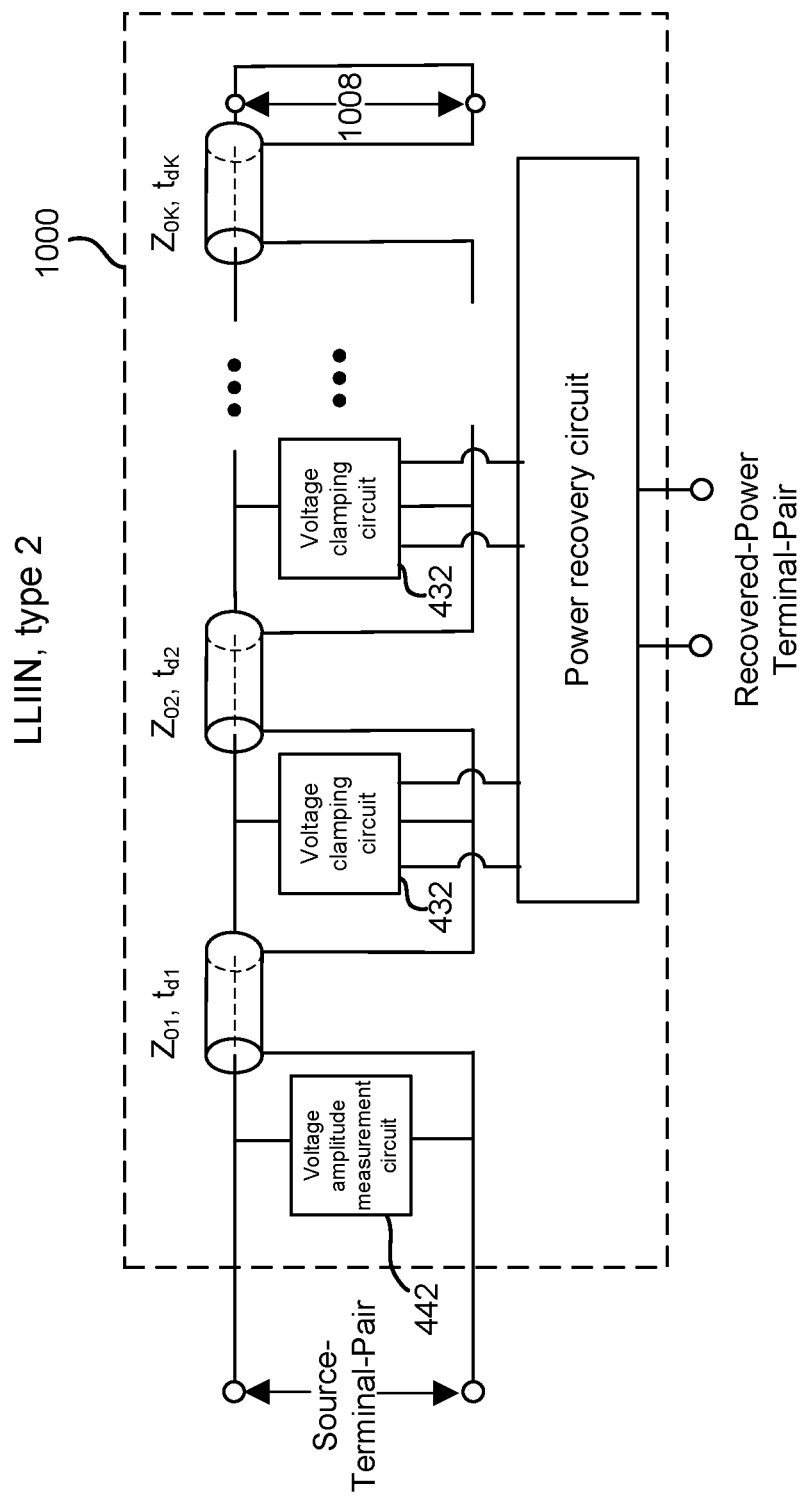
FIG. 10 is a schematic depicting another input impedance network.

Referring next to FIG. 10, shown is an exemplary LLIIN 1000 that may be used to realize the LLIIN 800 in FIG. 8 and the LLIIN 900 in FIG. 9. The LLIIN 1000 is similar to the LLIIN 400 except that the terminals of the load-terminal-pair 1008 are short circuited and current clamping circuits are not employed. Short circuiting the terminals of the load-terminal-pair 1008 presents a resistance (0Ω) that is smaller than the real part of the characteristic impedance of the transmission line to the load terminals; thus, a distributed-voltage-clamping circuit that clamps the voltage of each section to the peak voltage produced at the source side of the transmission line provides a substantially constant impedance to the circulator 804 without the use of current clamping circuits if the total electrical delay is equal to one half of the period of the applied power. Alternatively, the load-terminal pair may be open circuited and a total electrical delay equal to one quarter of the period of the applied power used. As a consequence, the LLIIN 1000 of FIG. 10 is simpler to implement than the LLIIN 400 described with reference to FIG. 4.

Figure 11A:
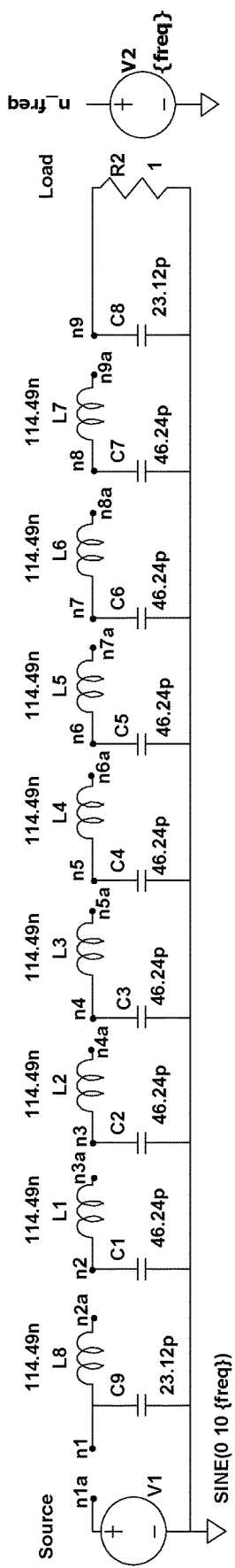
Figure 11B:
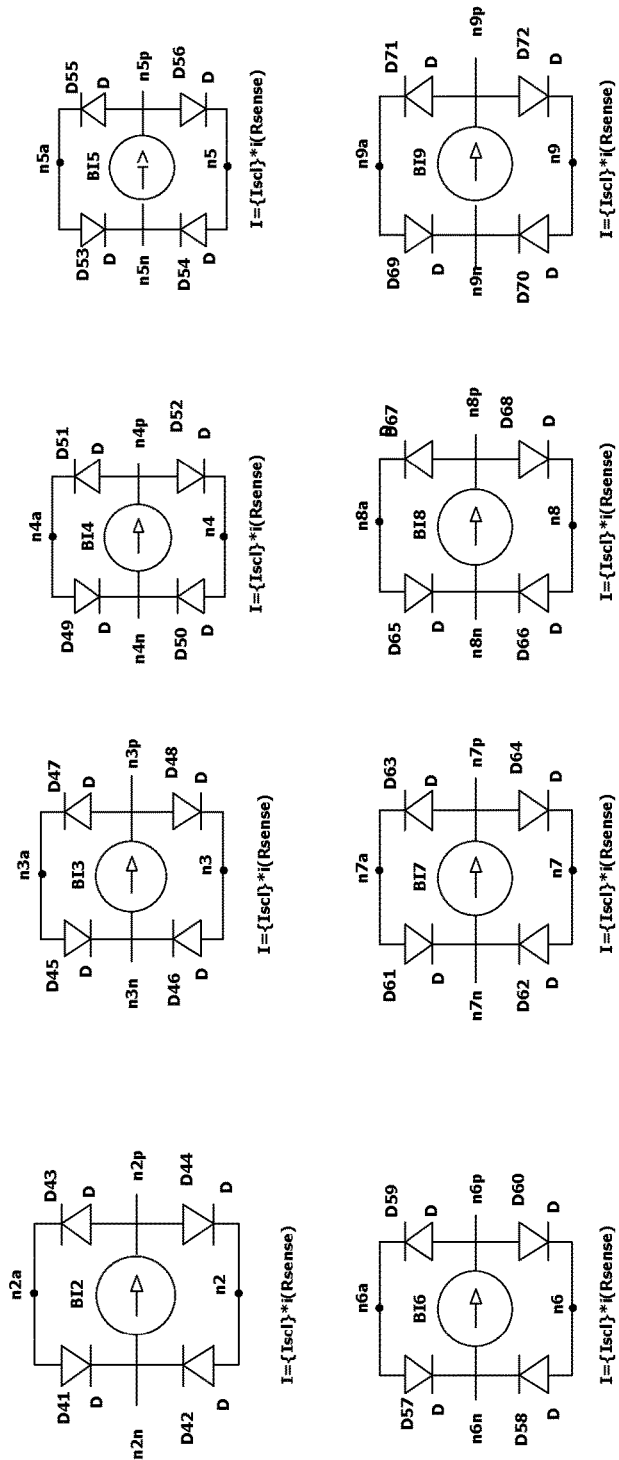
Figure 11C:
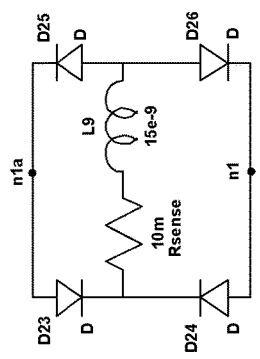
Figure 11E:
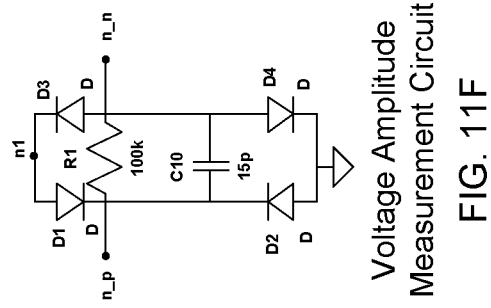
Figure 11E:
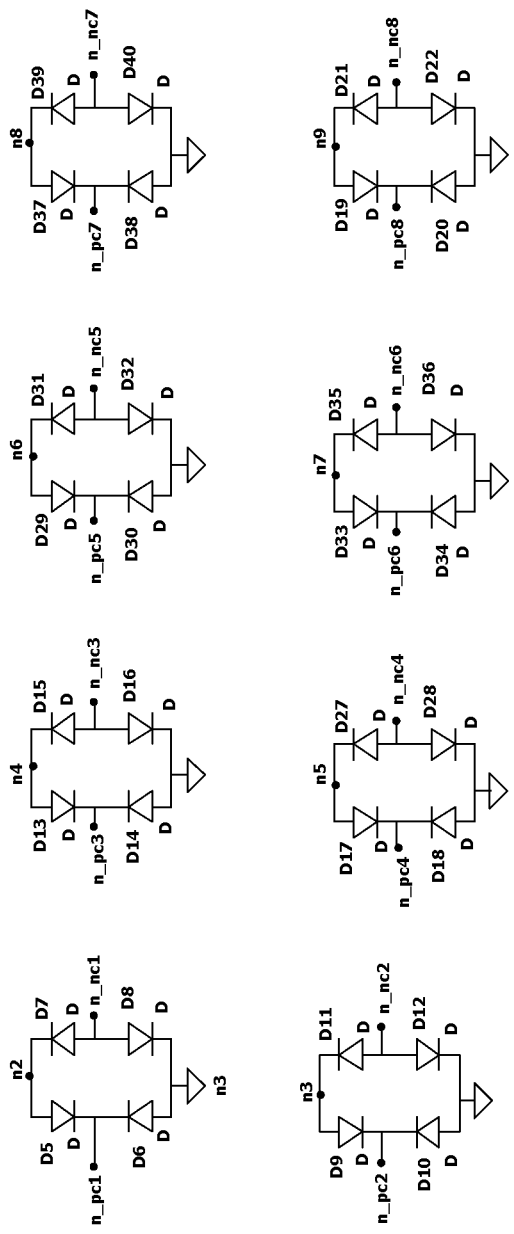
Figure 11E:
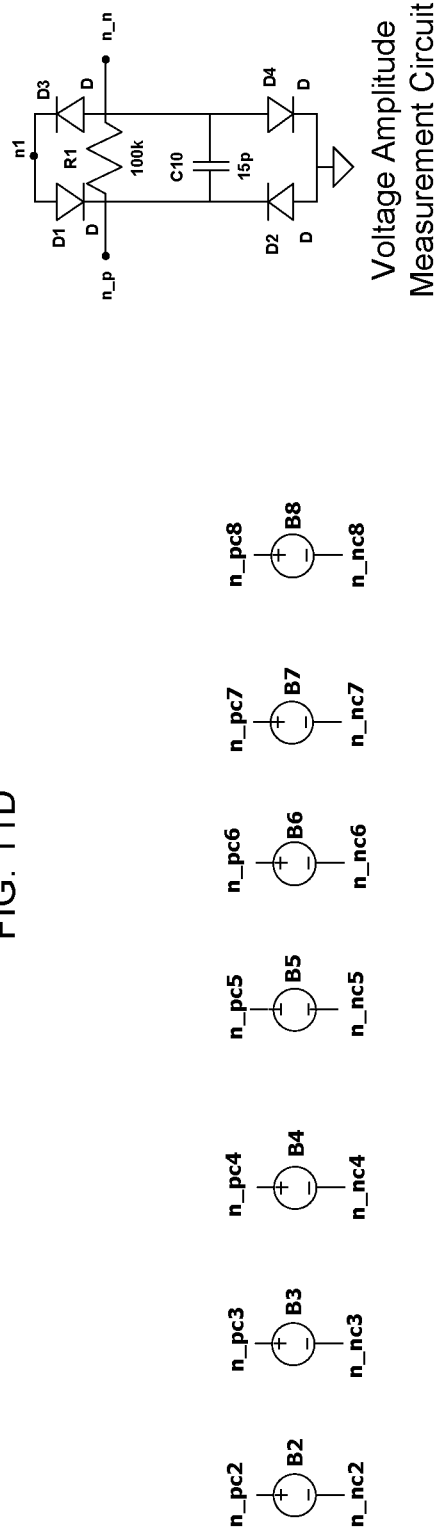
Figure 12:
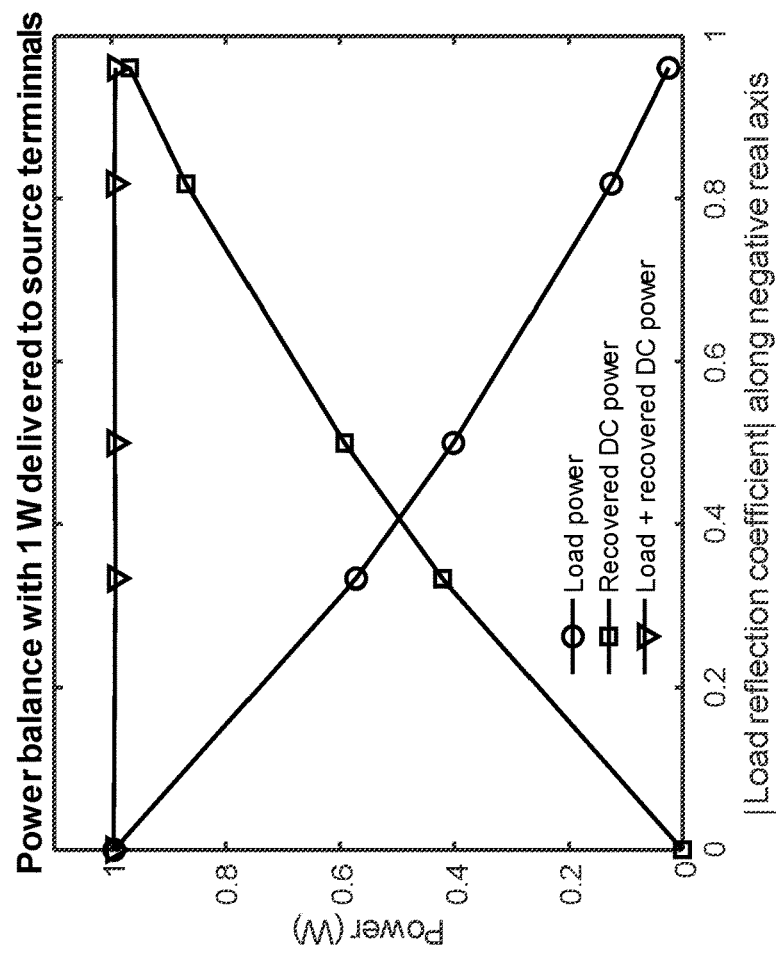
FIG. 12 is a Smith chart and a graph depicting operational aspects of the circuit of FIG. 11A-11F with resistive loads for which the load resistance is smaller than the real part of the characteristic impedance of the lumped-element-equivalent transmission line sections.
Figure 12:
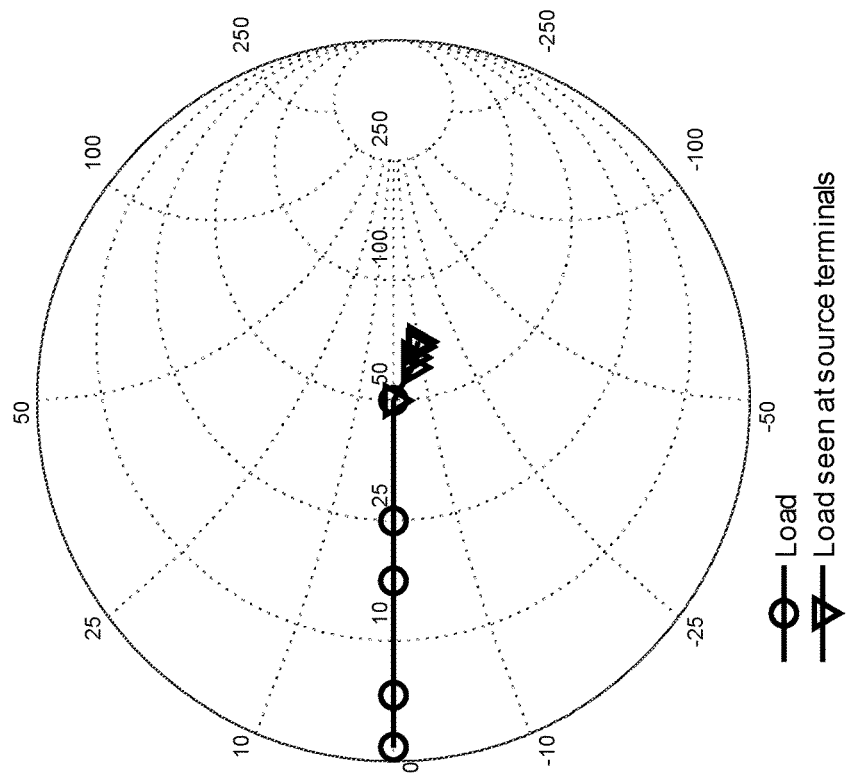

Referring next to FIGS. 11A-11F, shown is a schematic of a circuit used to verify the performance of a LLIIN using simulation. FIGS. 11A-11F depict a single circuit that is depicted across multiple pages for clarity. FIGS. 11A-11F, the nodes that have the same label are the same node. For example, nodes labeled as "n1a" and "n1" in FIG. 11A are the same nodes as "n1a" and "n1" in FIG. 11C. While referring to FIGS. 11A-11F, simultaneous reference is made to FIG. 12, which depicts simulation results for the circuit of FIGS. 11A-11F with resistive loads for which the load resistance is smaller than the real part of the characteristic impedance of the lumped element equivalent transmission line sections. Table 1 below provides additional details about the operational settings of the circuit depicted in FIGS. 11A-11F. The results in FIG. 12 are obtained by replacing the load (R2 in FIG. 11A), with different impedances and calculating the impedance seen by the source (V1 in FIG. 11A) as well as the power delivered by the source, the power delivered to the load and the power recovered by the voltage and current clamps (power returned to B1 through B8 of FIG. 11E and BI2 through BI9 in FIG. 11B). The Smith chart on the left of FIG. 12 shows that even as the load impedance is varied along the negative real axis of the Smith chart, the impedance seen by the source changes very little. The chart on the right of FIG. 12 shows that power delivered by the source and not to the load is recovered as DC power. The results of FIG. 12 are obtained with the peak voltage magnitude and peak current magnitude clamped to the amplitude of the voltage and current, respectively, at the source, i.e., the current and voltage (parameters Isc1 and Vsc1 in the table below) are both set equal to 1.0. The sources B1 through B8 and BI2 through BI9 are representative of the constant voltage and constant current provided to the voltage and current clamps, respectively, by circuits such as those shown in FIGS. 20A-20B and FIGS. 23A and 23B, respectively.

TABLE 1

| Construct (if applicable) | Setting/Logic |
| --- | --- |
| Source (V1) | .param freq = 13.56meg Isc1 = 1.2 Vsc1 = 1.2 |
| | .model D D(Ron = 1m Roff = 1Meg Vfwd = 1m) |
| | .meas Aavg1 avg V(n1) |
| | .meas Bavg1 avg −I(V1) |
| | .meas Are1 avg (V(n1) − Aavg1)*cos(360*time*v(n_freq)) |
| | .meas Aim1 avg −(V(n1) − Aavg1)*sin(360*time*v(n_freq)) |
| | .meas Bre1 avg (−I(v1) − Bavg1)*cos(360*time*v(n_freq)) |
| | .meas Bim1 avg −(−I(v1) − avg1)*sin(360*time*v(n_freq)) |
| | .meas Rdrv1 param (Are1*Bre1 + Aim1*Bim1)/(Bre12 + Bim12) |
| | .meas Xdrv1 param (Aim1*Bre1 − Are1*Bim1)/(Bre12 + Bim12) |
| | .meas Pin avg −i(v1)*v(n1) |
| | .meas Pout avg i(R2)*v(n9) |
| | .meas Pdcv avg −i(B1)*v(n_pc1, n_nc1) − i(B2)*v(n_pc2, n_nc2) −i(B3)*v(n_pc3, n_nc3) − i(B4)*v(n_pc4, n_nc4) + −i(B5)*v(n_pc5, n_nc5) − (B6)*v(n_pc6, n_nc6) −i(B7)*v(n_pc7, n_nc7) − i(B8)*v(n_pc8, n_nc8) |
| | .meas Pdcv2 param 1.0*Pdcv |
| | .meas Pdci avg i(BI2)*v(n2p, n2n) + i(BI3)*v(n3p, n3n) + i(BI4)*v(n4p, n4n) + i(BI5)*v(n5p, n5n) + + i(BI6)*v(n6p, n6n) + i(BI7)*v(n7p, n7n) + i(BI8)*v(n8p, n8n) + i(BI9)*v(n9p, n9n) |
| | .meas Pdci2 param 1.0*Pdci |
| | .meas Pdc param Pdcv + Pdci |

TABLE 1-continued

| Construct (if applicable) | Setting/Logic |
|---|---|
| | .param t0 = 1u |
| | .param t1 = t0 + 20/freq |
| | .tran 0 {t1} {t0} 1n |
| BI2-BI9 | I = {Iscl}*i(Rsense) |
| B1 | V = {Vscl}*v(n_p, n_n) |
| B2 | V = {Vscl}*v(n_p, n_n) |
| B3 | V = {Vscl}*v(n_p, n_n) |
| B4 | V = {Vscl}*v(n_p, n_n) |
| B5 | V = {Vscl}*v(n_p, n_n) |
| B6 | V = {Vscl}*v(n_p, n_n) |
| B7 | V = {Vscl}*v(n_p, n_n) |
| B8 | V = {Vscl}*v(n_p, n_n) |

Figure 13:
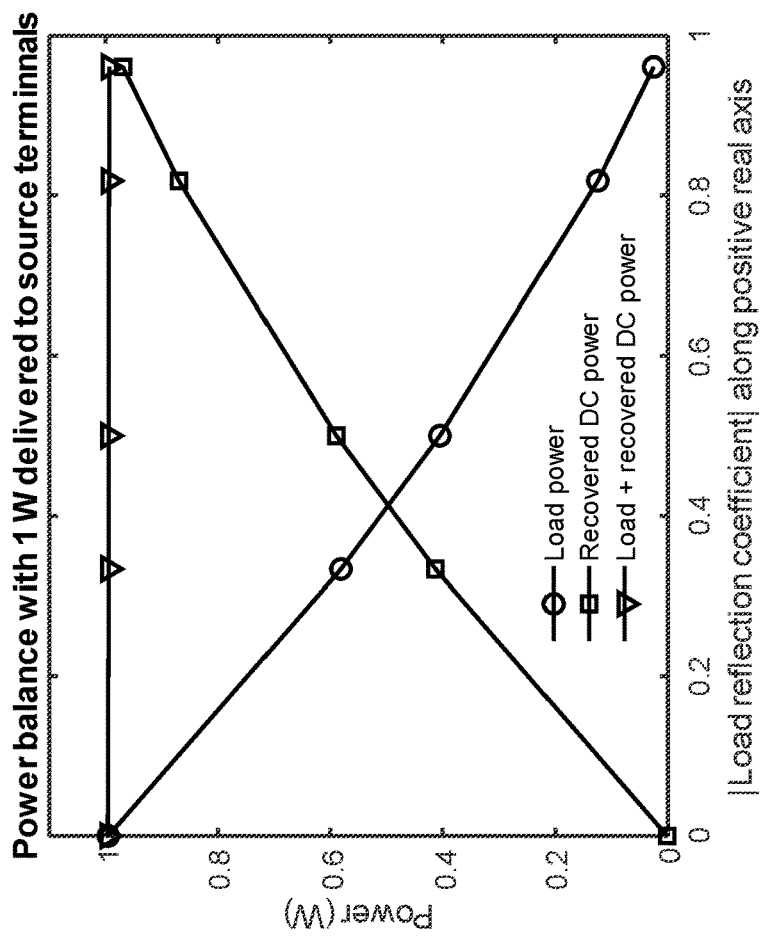
FIG. 13 is a Smith chart and a graph depicting operational aspects of the circuit in FIG. 11A-11F with resistive loads for which the load resistance is larger than the real part of the characteristic impedance of the lumped-element-equivalent transmission line sections.
Figure 13:
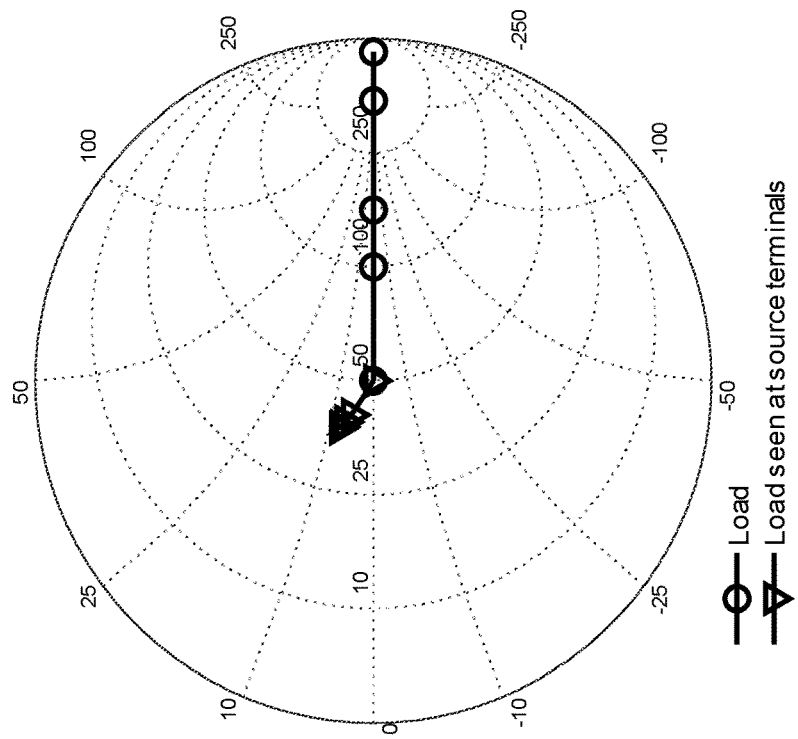

Referring next to FIG. 13, shown are simulation results for the circuit of FIGS. 11A-11F with resistive loads for which the load resistance is larger than the real part of the characteristic impedance of the lumped element equivalent transmission line sections. The results in FIG. 13 are obtained by replacing the load (R2 in FIG. 11A), with different impedances and calculating the impedance seen by the source (V1 in FIG. 11A) as well as the power delivered by the source, the power delivered to the load and the power recovered by the voltage and current clamps (power returned to B1 through B8 and BI2 through BI9). The Smith chart on the left of FIG. 13 shows that even as the load impedance is varied along the positive real axis of the Smith chart, the impedance seen by the source changes very little. The chart on the right of FIG. 13 shows that power delivered by the source and not to the load is recovered as DC power. The results of FIG. 13 are obtained with the peak voltage magnitude and peak current magnitude clamped to the amplitude of the voltage and current, respectively, at the source, i.e. the parameters Iscl and Vscl are both set equal to 1.0.

Figure 14:
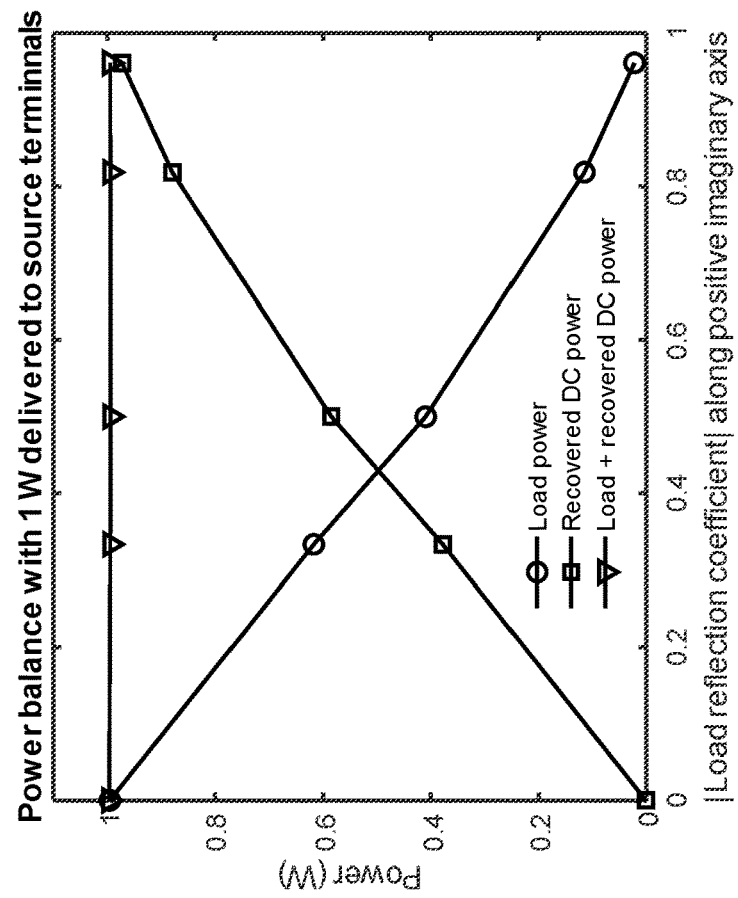
FIG. 14 is a Smith chart and a graph depicting operational aspects of the circuit in FIG. 11A-11F with reactive loads for which the load reactance is positive.
Figure 14:
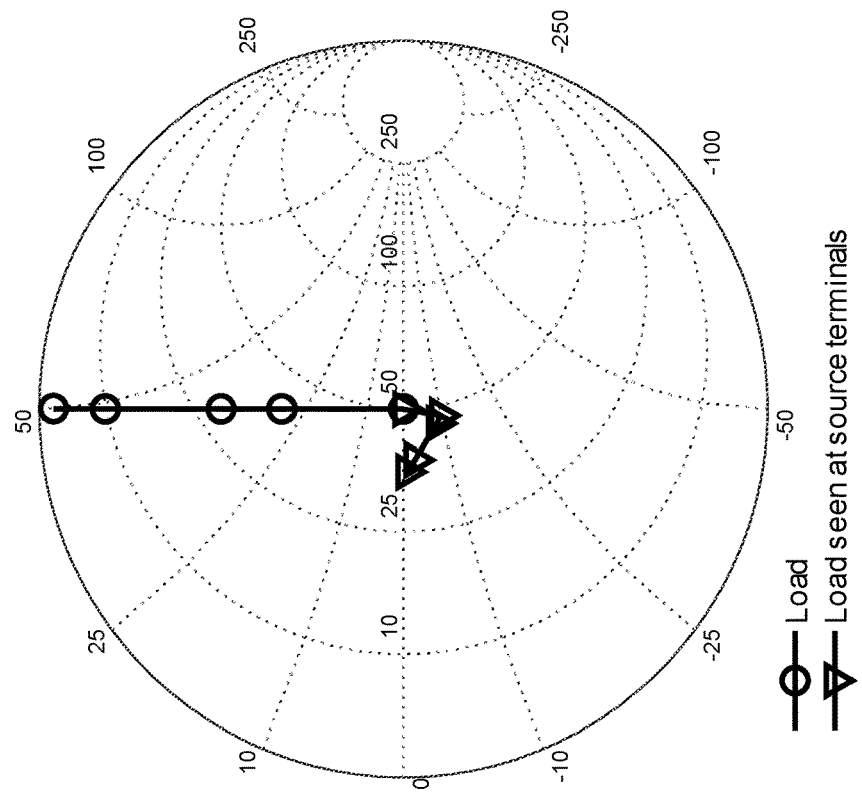

Referring next to FIG. 14, shown are simulation results for the circuit of FIG. 11 with reactive loads for which the load reactance is positive. The results in FIG. 14 are obtained by replacing the load (R2 in FIG. 11A), with different impedances and calculating the impedance seen by the source (V1 in FIG. 11A) as well as the power delivered by the source, the power delivered to the load and the power recovered by the voltage and current clamps (power returned to B1 through B8 and BI2 through BI9). The Smith chart on the left of FIG. 14 shows that even as the load impedance is varied along the positive imaginary axis of the Smith chart, the impedance seen by the source changes very little. The chart on the right of FIG. 14 shows that power delivered by the source and not to the load is recovered as DC power. The results of FIG. 14 are obtained with the peak voltage magnitude and peak current magnitude clamped to the amplitude of the voltage and current, respectively, at the source, i.e. the parameters Iscl and Vscl, are both set equal to 1.0.

Figure 15:
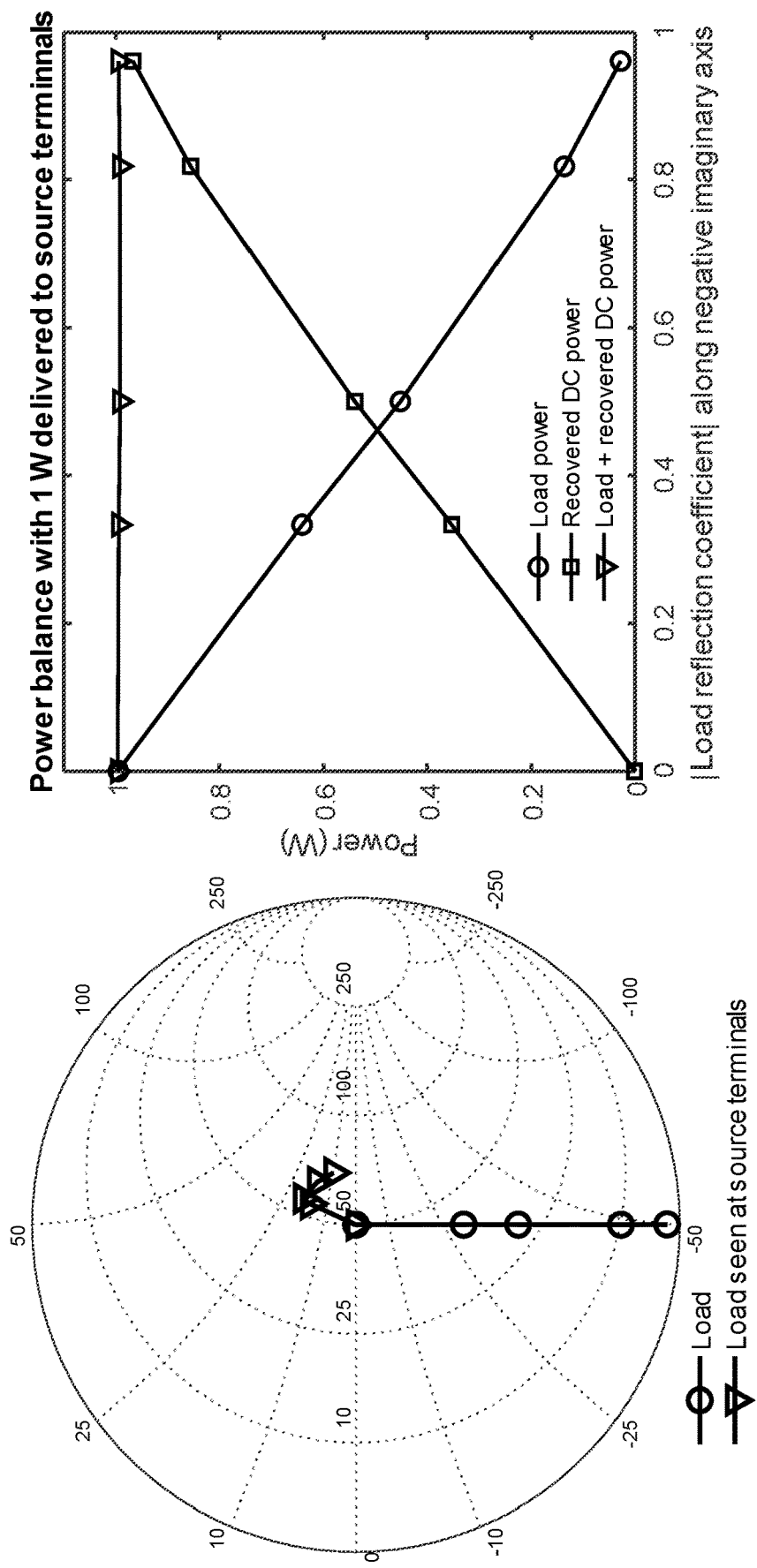
FIG. 15 is a Smith chart and graph depicting operational aspects of the circuit in FIG. 11A-11F with reactive loads for which the load reactance is negative.

Referring next to FIG. 15, shown are simulation results for the circuit of FIG. 11 with reactive loads for which the load reactance is negative. The results in FIG. 15 are obtained by replacing the load (R2 in FIG. 11), with different impedances and calculating the impedance seen by the source (V1 in FIG. 11) as well as the power delivered by the source, the power delivered to the load and the power recovered by the voltage and current clamps (power returned to B1 through B8 and BI2 through BI9 in FIG. 11). The Smith chart on the left of FIG. 15 shows that even as the load impedance is varied along the negative imaginary axis of the Smith chart, the impedance seen by the source changes very little. The chart on the right of FIG. 15 shows that power delivered by the source and not to the load is recovered as DC power. The results of FIG. 15 are obtained with the peak voltage magnitude and peak current magnitude clamped to the amplitude of the voltage and current, respectively, at the source, i.e. the parameters Iscl and Vscl shown on the schematic of FIG. 11 are both set equal to 1.0.

Figure 16:
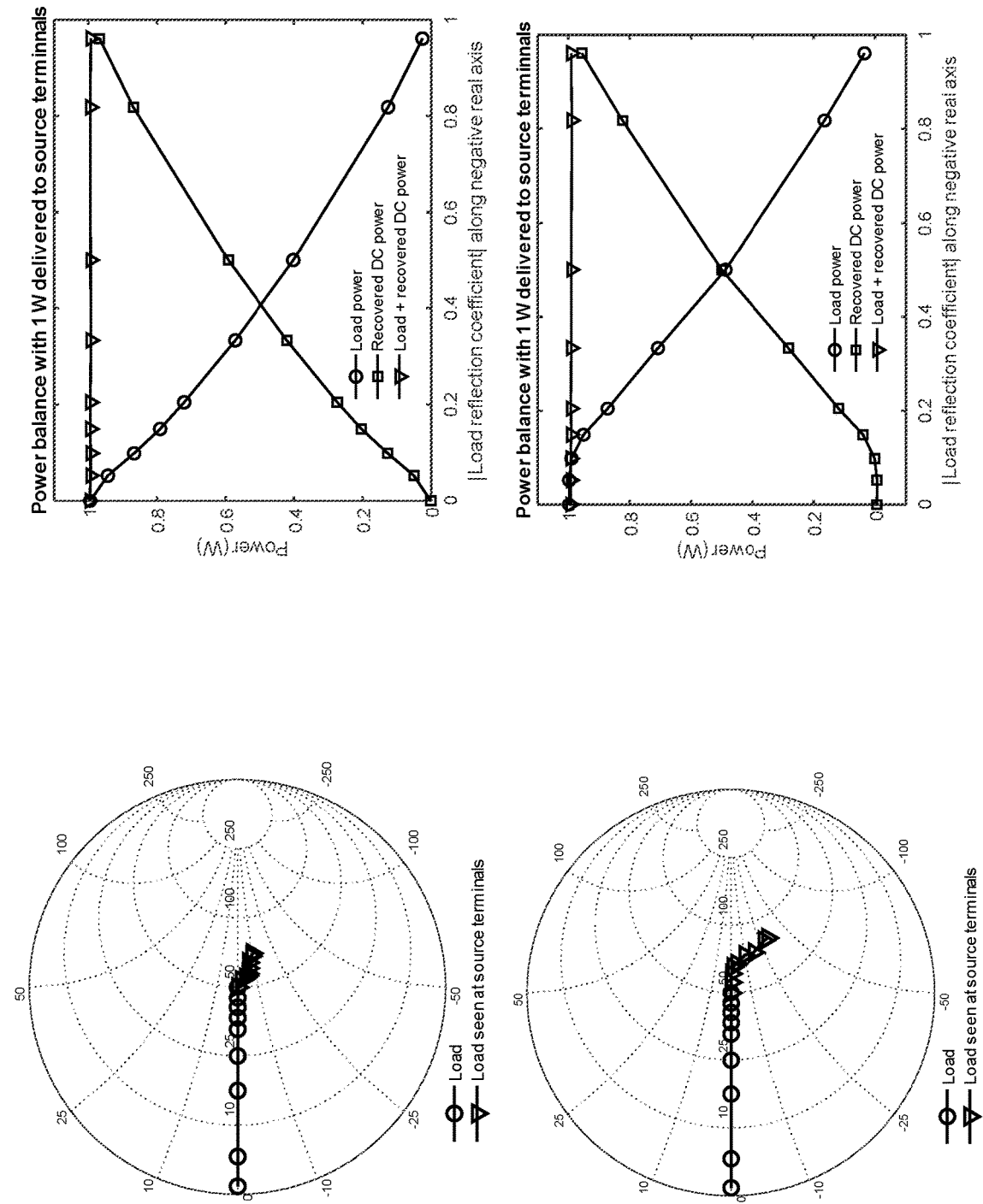
FIG. 16 is a Smith chart and graph depicting operational aspects of the circuit in FIG. 11A-11F with resistive loads for which the load resistance is smaller than the real part of the characteristic impedance of the lumped-element-equivalent transmission line sections for two different levels for voltage and current clamping.

Referring next to FIG. 16 are simulation results for the circuit of FIG. 11 with resistive loads for which the load resistance is smaller than the real part of the characteristic impedance of the lumped element equivalent transmission line sections for two different levels for voltage and current clamping. The two graphs in the top row of FIG. 16 are a repeat of the results shown in FIG. 12 with a few more data points. The two graphs in the bottom row of FIG. 16 show the effect of clamping the peak voltage and current magnitude at 1.2 times the amplitude of the voltage and current, respectively, at the source side of the circuit (i.e. the parameters Iscl and Vscl shown on the schematic of FIG. 11 are both set equal to 1.2). This is desirable in certain applications to allow a larger fraction of the source power to go the load for small values of load reflection coefficient magnitude as a comparison of the two right side graphs of FIG. 16 illustrates. The left two graphs of FIG. 16 show that this is done at the expense of more variation in the impedance presented to the source.

Figure 17:
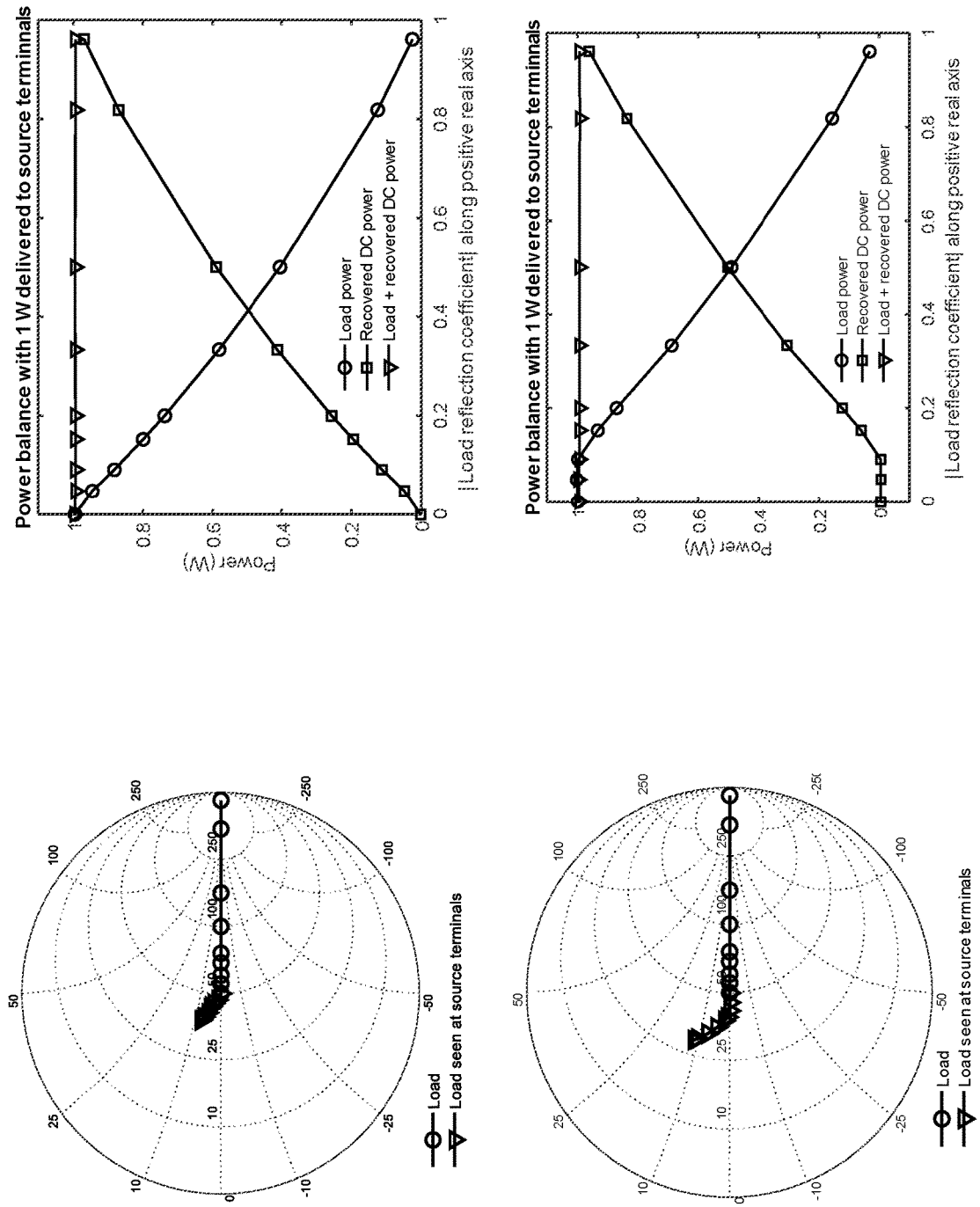
FIG. 17 is a Smith chart and graph depicting operational aspects of the circuit in FIG. 11A-11F with resistive loads for which the load resistance is larger than the real part of the characteristic impedance of the lumped-element-equivalent transmission line sections for two different levels for voltage and current clamping.

Referring next to FIG. 17, shown are simulation results for the circuit of FIG. 11 with resistive loads for which the load resistance is larger than the real part of the characteristic impedance of the lumped element equivalent transmission line sections for two different levels for voltage and current clamping. The two graphs in the top row of FIG. 17 are a repeat of the results shown in FIG. 13 with a few more data points. The two graphs in the bottom row of FIG. 17 show the effect of clamping the peak voltage and current magnitude at 1.2 times the amplitude of the voltage and current, respectively, at the source side of the circuit (i.e. the parameters Iscl and Vscl shown on the schematic of FIG. 11 are both set equal to 1.2). This is desirable in certain applications to allow a larger fraction of the source power to go the load for small values of load reflection coefficient magnitude as a comparison of the two right side graphs of FIG. 17 illustrates. The left two graphs of FIG. 17 show that this is done at the expense of more variation in the impedance presented to the source.

Figure 18:
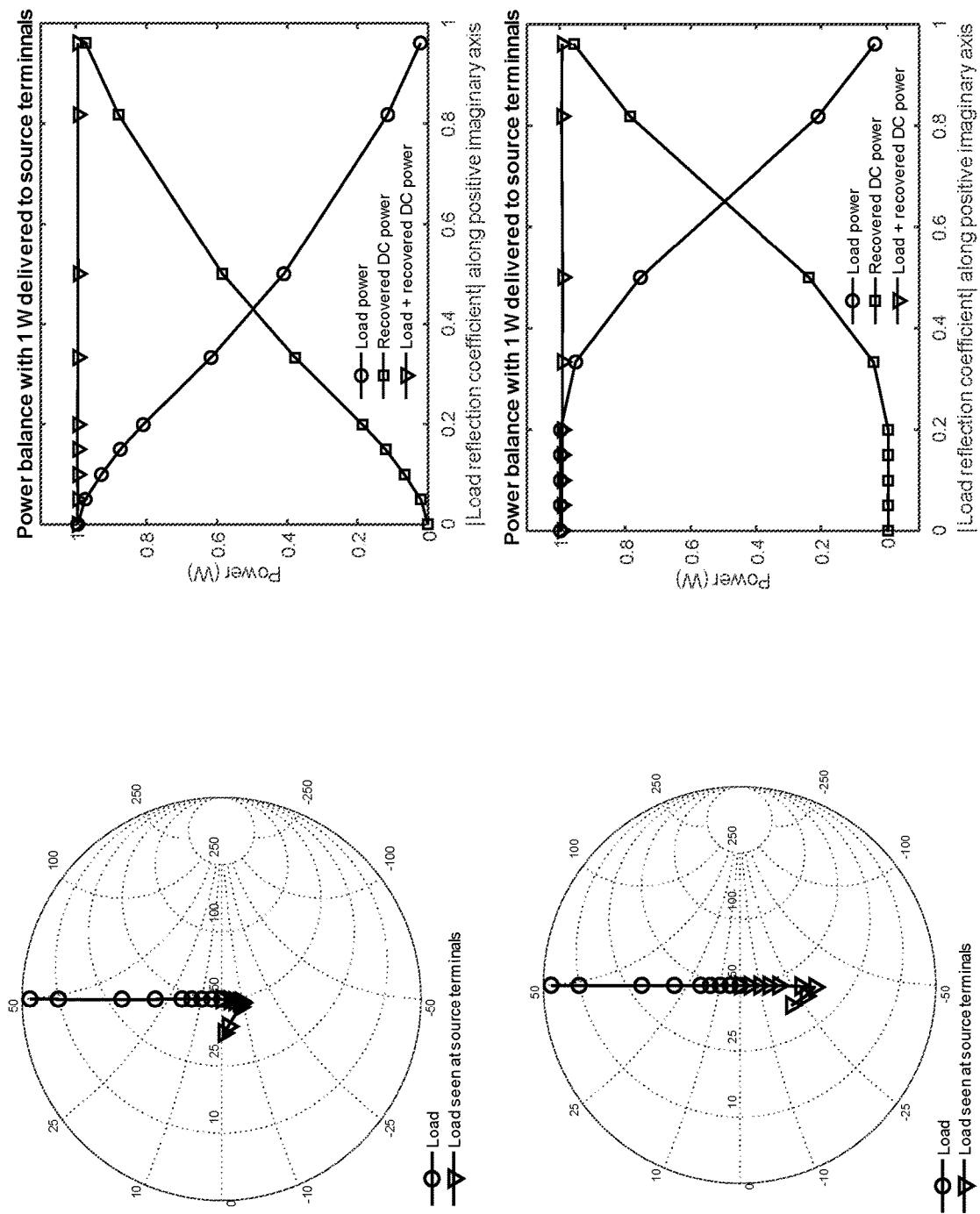
FIG. 18 is a Smith chart and graph depicting operational aspects of the circuit in FIG. 11A-11F with reactive loads for which the load reactance is positive for two different levels for voltage and current clamping.

Referring next to FIG. 18, shown are simulation results for the circuit of FIG. 11 with reactive loads for which the load reactance is positive for two different levels for voltage and current clamping. The two graphs in the top row of FIG. 18 are a repeat of the results shown in FIG. 14 with a few more data points. The two graphs in the bottom row of FIG. 18 show the effect of clamping the peak voltage and current magnitude at 1.2 times the amplitude of the voltage and current, respectively, at the source side of the circuit (i.e. the parameters Isc1 and Vsc1 shown on the schematic of FIG. 11 are both set equal to 1.2). This is desirable in certain applications to allow a larger fraction of the source power to go to the load for small values of load reflection coefficient magnitude as a comparison of the two right side graphs of FIG. 18 illustrates. The left two graphs of FIG. 18 show that this is done at the expense of more variation in the impedance presented to the source.

Figure 19:
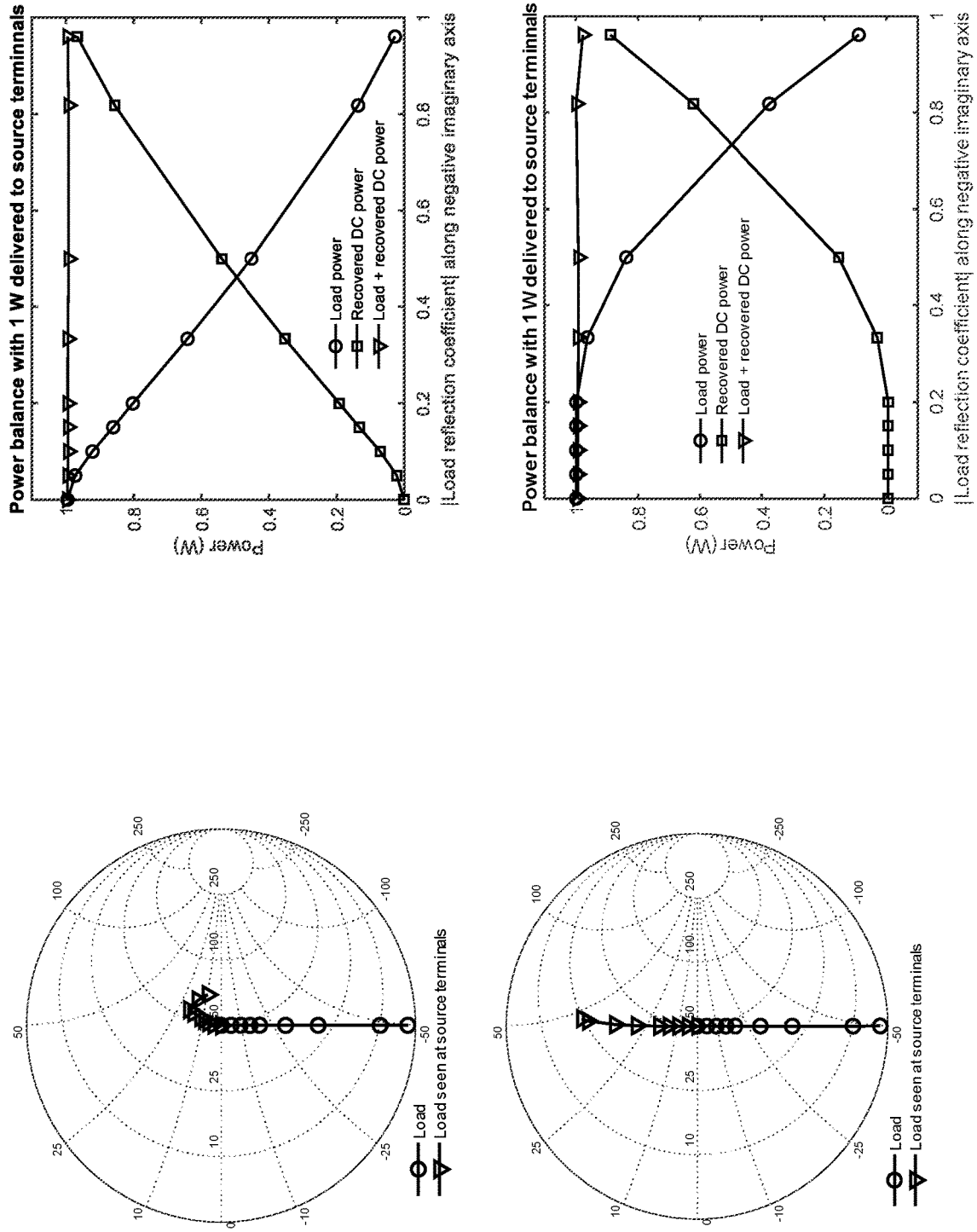
FIG. 19 is a Smith chart and graph depicting operational aspects of the circuit in FIG. 11A-11F with reactive loads for which the load reactance is negative for two different levels for voltage and current clamping.

Referring next to FIG. 19 are simulation results for the circuit of FIG. 11 with reactive loads for which the load reactance is negative for two different levels for voltage and current clamping. The two graphs in the top row of FIG. 19 are a repeat of the results shown in FIG. 15 with a few more data points. The two graphs in the bottom row of FIG. 19 show the effect of clamping the peak voltage and current magnitude at 1.2 times the amplitude of the voltage and current, respectively, at the source side of the circuit (i.e., the parameters Isc1 and Vsc1 shown on the schematic of FIG. 11 are both set equal to 1.2). This is desirable in certain applications to allow a larger fraction of the source power to go the load for small values of load reflection coefficient magnitude as a comparison of the two right side graphs of FIG. 19 illustrates. The left two graphs of FIG. 19 show that this is done at the expense of more variation in the impedance presented to the source.

Figure 20A:
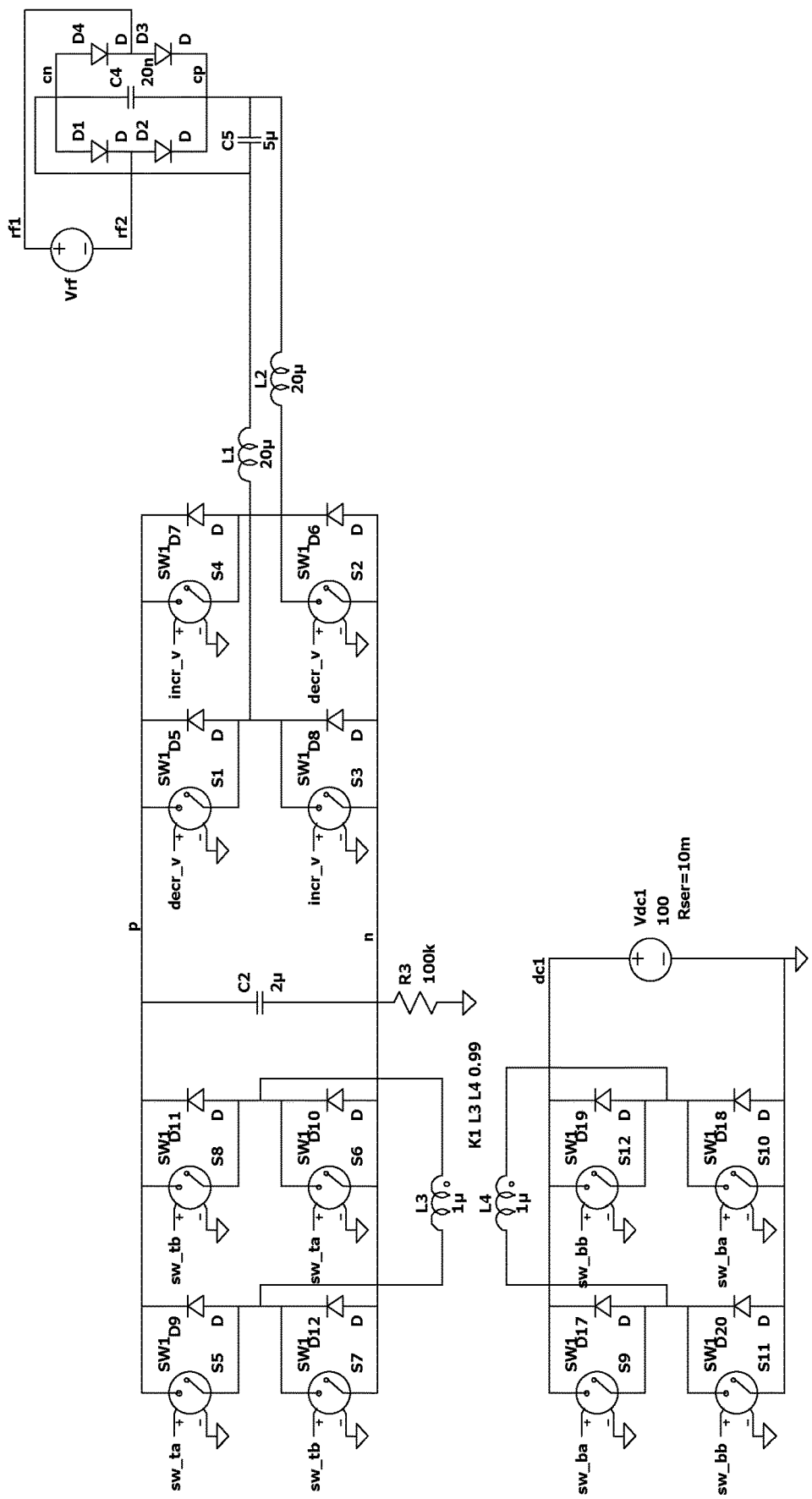
FIGS. 20A and 20B are schematics depicting an example of a power recovery circuit.
Figure 20B:
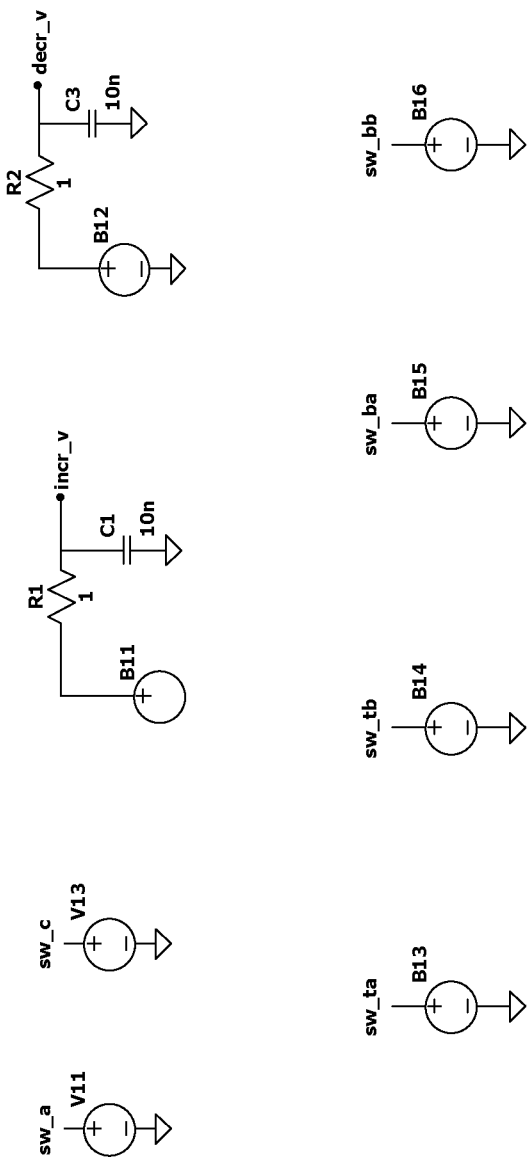

Referring next to FIGS. 20A and 20B shown is a schematic of a circuit used to verify the performance of a voltage clamp with power recovery to a DC power sink maintained at 100 V (Vdc1 in FIGS. 20A and 20B). The nodes in FIGS. 20A and 20B that have the same label are the same nodes. For example, the nodes labels "decr_v" and "incr_v" in FIG. 20A are the same nodes as "decr_v" and "incr_v" in FIG. 20B. In operation, the top bridge formed by S5, S6, S7, and S8 and bottom bridge formed by S9, S10, S11, and S12 take turns to operate. When the top bridge is operational it completes a cycle in which first S5 and S6 are on and then S7 an S8 are on. The result of this operation of the top bridge is to create a voltage across the windings of the transformer formed by the coupled inductors L3 and L4. During this cycle, if the voltage over C2 is larger than the voltage of the constant voltage source Vdc1, power is transferred from C2 to Vdc1 through the rectifying action of the bottom diodes D17, D18, D19, and D20. If the voltage over C2 is smaller than the voltage of the constant voltage source Vdc1, no power is transferred between the top and bottom halves of the circuit during this cycle. The top half of the circuit is that half that is connected directly or through other circuit elements to L3. The bottom half of the circuit is that half that is connected directly or through other circuit elements to L4. When the bottom bridge is operational it completes a cycle in which first S9 and S10 and then S11 and S12 are on. The result of this operation of the bottom bridge is to create a voltage across the windings of the transformer formed by the coupled inductors L3 and L4. If the voltage over C2 is less than the voltage of the constant voltage source Vdc1, power is transferred from Vdc1 to C2 through the rectifying action of the top diodes D9, D10, D11, and D12. If the voltage over C2 is larger than the voltage of the constant voltage source Vdc1, no power is transferred between the top and bottom halves of the circuit during this cycle. Both cycles together maintain a voltage over C2 that is substantially equal to the voltage of the constant voltage source Vdc1 with bi-directional power flow between C2 and Vdc1 in order to maintain this relationship.

In FIGS. 20A and 20B, the bridge formed by S1, S2, S3, and S4 maintains the desired clamping voltage minus two diode voltage drops over C5. The bridge does this by turning on S3 and S4 when the voltage over C5 is too low, and S1 and S2 when the voltage is too high. And the voltage between the nodes rf1 and rf2 is clamped to the voltage over C5 plus two voltage drops through the diodes D1, D2, D3, and D4. Table 2 below provides additional details about settings utilized for the simulation.

TABLE 2

| Construct (if applicable) | Setting/Logic |
|---|---|
|  | .param Vlim = 50 |
|  | .model sw1 sw(Ron = 10m Roff = 1meg |
|  | Vt = 0 Vh = 0.1) |
|  | .model D D(Ron = 10m Roff = 100k |
|  | Vfwd = 0.5) |
|  | .tran 0 1000u 0 1n |
| V11 | SINE(0 1 5meg) |
| V13 | SINE(0 1 2.5meg) |
| B11 | V = if(v(cp, cn) < {Vlim − 1}, 1, −1) |
| B12 | V = if(v(cp, cn) > {Vlim − 1}, 1, −1) |
| B13 | V = if(v(sw_c) > 0, v(sw_a), −1) |
| B14 | V = if(v(sw_c) > 0, −v(sw_a), −1) |
| B15 | V = if(v(sw_c) < 0, v(sw_a), −1) |
| B16 | V = if(v(sw_c) < 0, −v(sw_a), −1) |
| Vrf | Rser = 1; SINE(0 60 10meg) |

Figure 21:
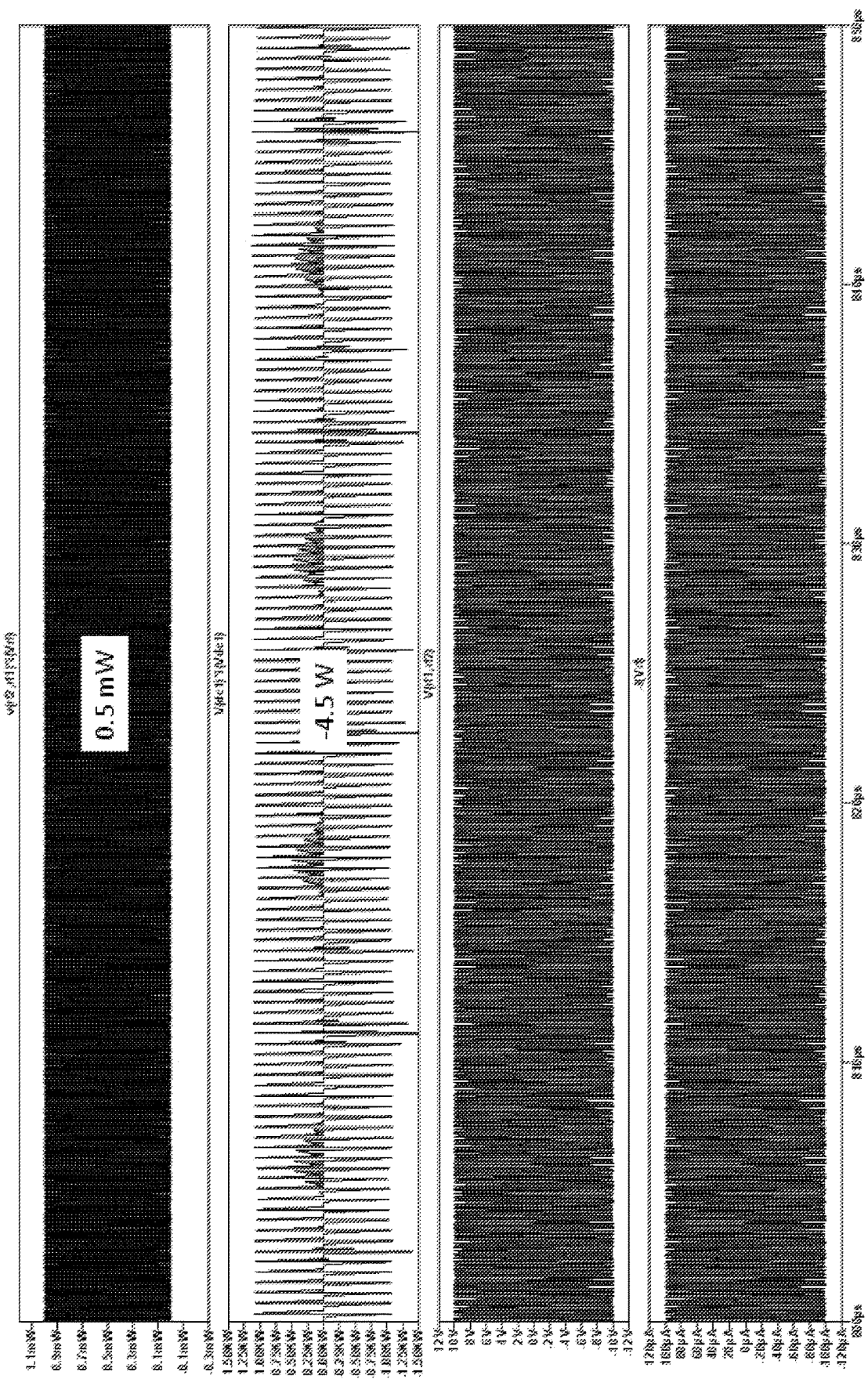
FIG. 21 includes graphs depicting power, voltage and current of the power recovery circuit of FIGS. 20A and 20B when the voltage to be clamped is less than the clamping voltage.

Referring next to FIG. 21 shown is the result of simulating the circuit of FIG. 20 when the voltage to be clamped (Vrf in FIG. 20) is less than the clamping voltage (50 V in this simulation). The bottom graph in FIG. 21 shows that the peak current through the voltage clamp is only 100 µA when the voltage amplitude is 10 V. The second from bottom graphs shows the voltage over the voltage clamp. The third from bottom graph shows that the voltage clamp takes 4.5 W from the DC power sink due to losses in the non-ideal diodes. The top graph shows that almost no power is taken from the voltage source connected to the voltage clamp.

Figure 22:
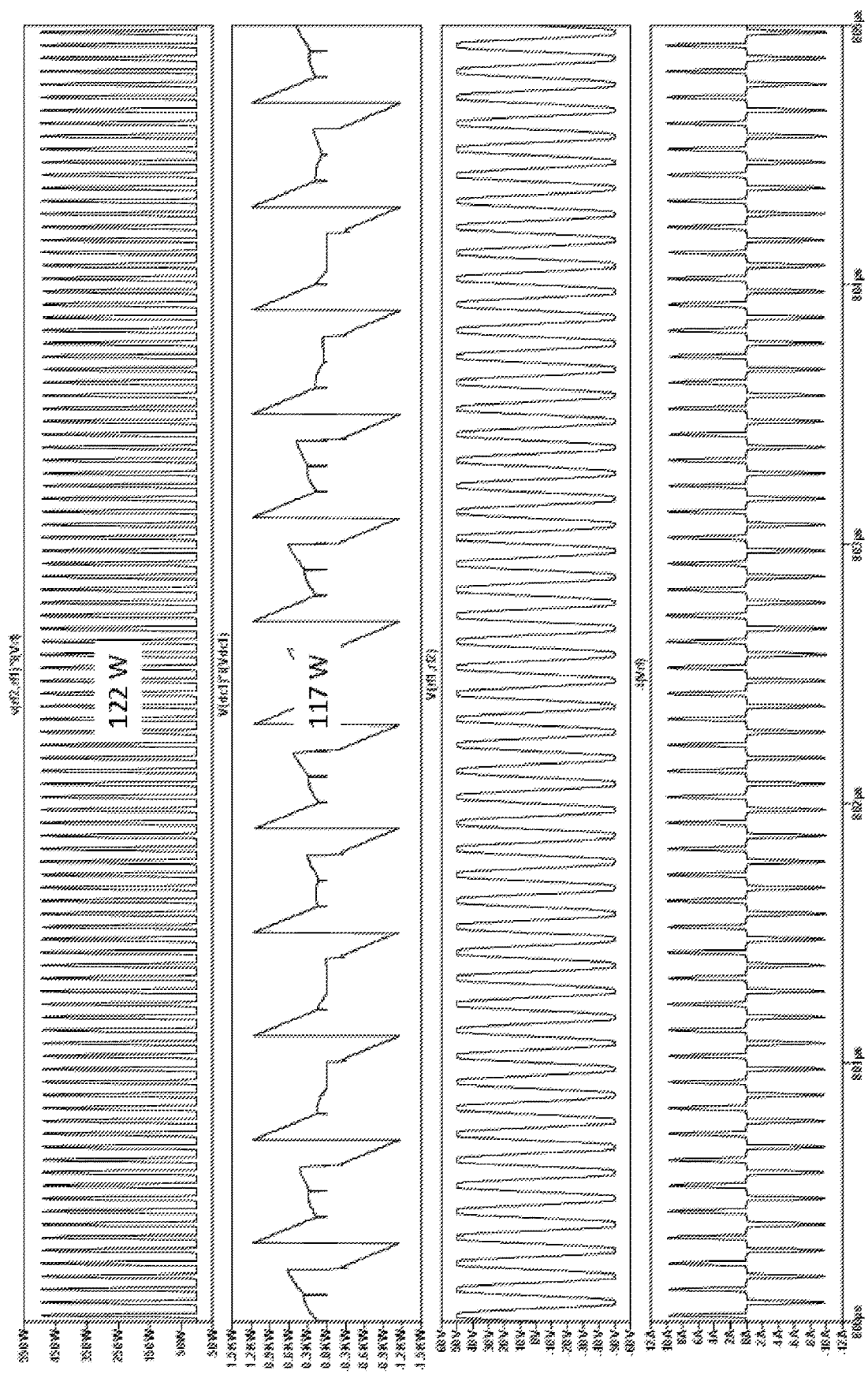
FIG. 22 includes graphs depicting power, voltage and current of the power recovery circuit of FIGS. 20A and 20B when the voltage to be clamped is larger than the clamping voltage.

Referring next to FIG. 22 shown is the result of simulating the circuit of FIG. 20 when the voltage to be clamped (Vrf in FIG. 20) is larger than the clamping voltage (50 V in this simulation). The bottom graph in FIG. 22 shows that the peak current through the voltage clamp is 10 A in order to achieve a 10 V voltage drop over the 1Ω internal resistance of the source (Vrf in FIG. 20) and clamp the peak voltage over the voltage clamp to 50 V. The second from bottom graphs shows the voltage over the voltage clamp that is clamped at 50 V as intended. The third from bottom graph shows that the voltage clamp recovers 117 Watts to the DC power sink. The top graph shows that 122 Watts is taken from the voltage source connected to the voltage clamp.

Figure 23A:
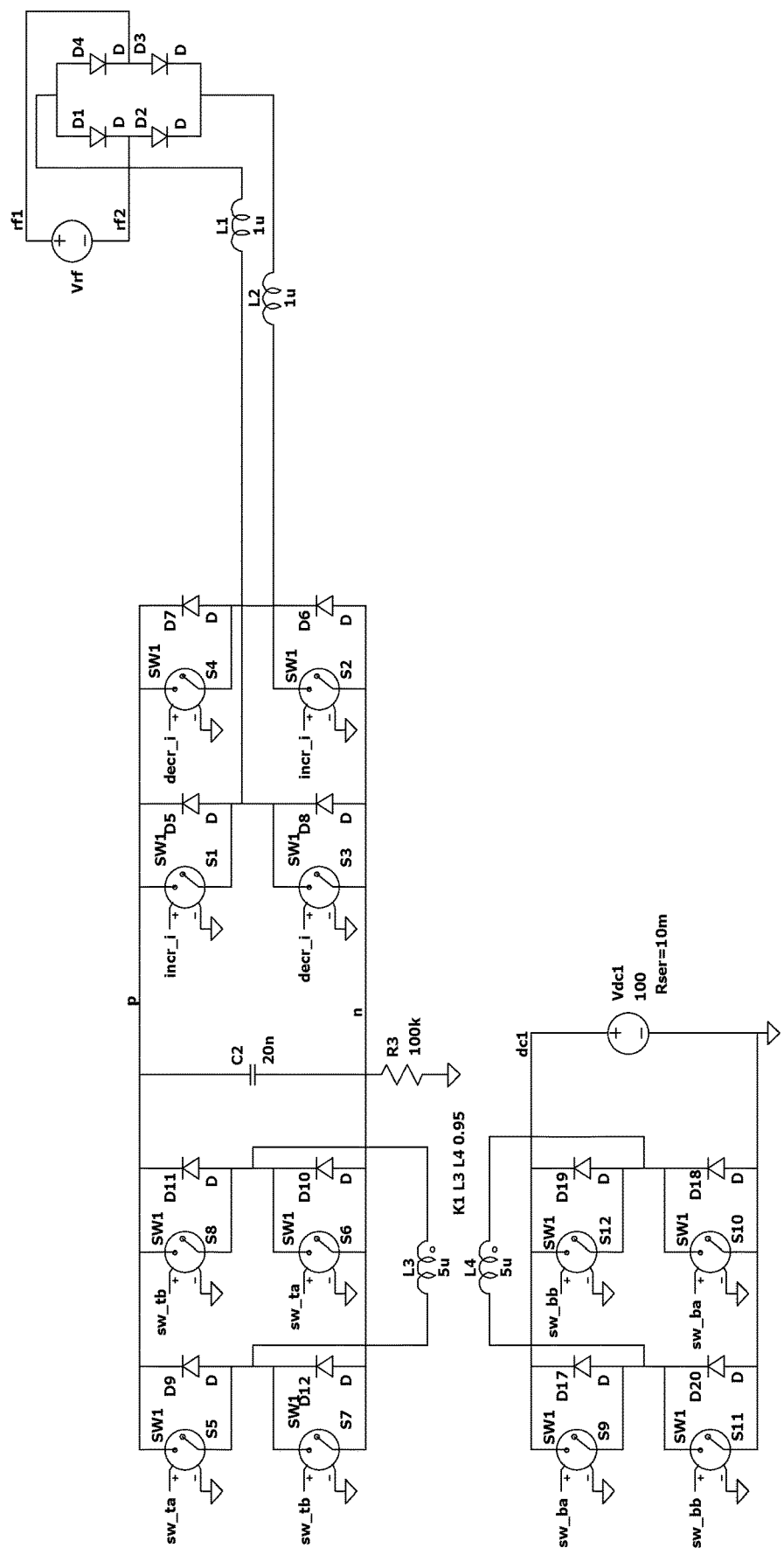
FIGS. 23A and 23B are schematics depicting another example of a power recovery circuit.
Figure 23B:
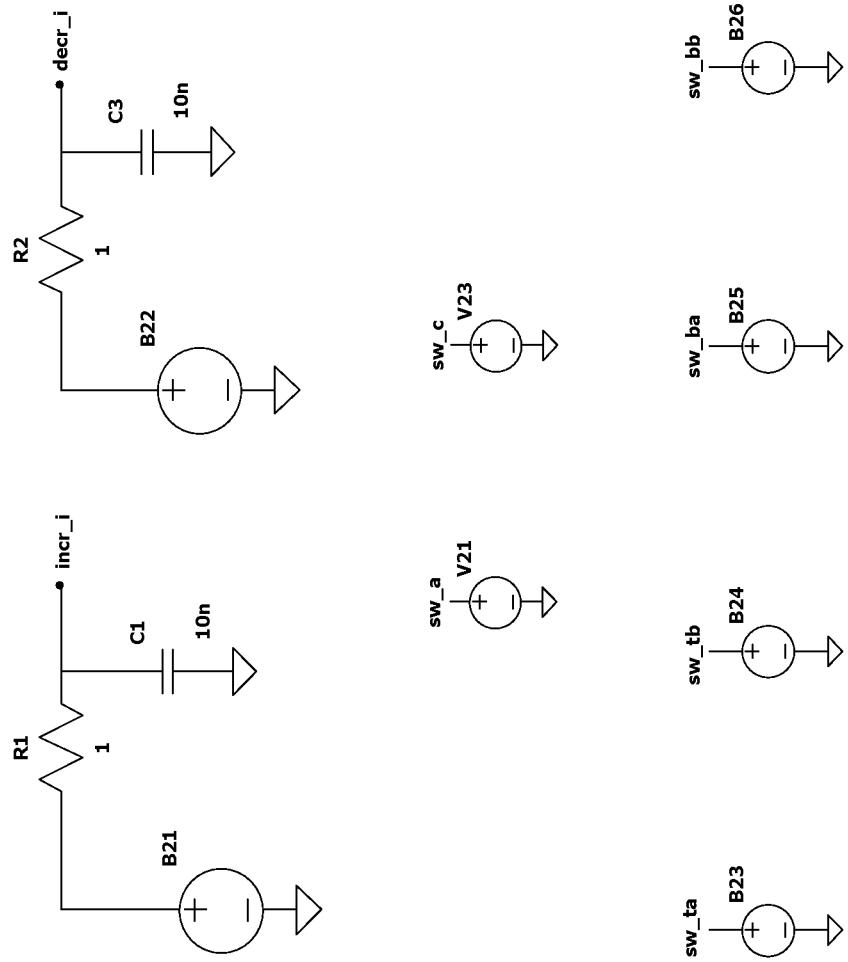

Referring next to FIGS. 23A and 23B shown are schematics of a circuit used to verify the performance of a current clamp with power recovery to a DC power sink maintained at 100 V (Vdc1 in FIG. 23A). The nodes in FIGS. 23A and 23B that have the same label are the same nodes. For example, the nodes labels "decr_i" and "incr_i" in FIG. 20A are the same nodes as "decr_i" and "incr_i" in FIG. 23B. In FIG. 23A, the top bridge formed by S5, S6, S7, and S8 and bottom bridge formed by S9, S10, S11, and S12 take turns to operate. When the top bridge is operational it completes a cycle in which first S5 and S6 are on and then S7 an S8 are on. The result of this operation of the top bridge is to create a voltage across the windings of the transformer formed by the coupled inductors L3 and L4. During this cycle, if the voltage over C2 is larger than the voltage of the constant voltage source Vdc1, power is transferred from C2 to Vdc1 through the rectifying action of the bottom diodes D17, D18, D19, and D20. If the voltage over C2 is smaller than the voltage of the constant voltage source Vdc1, no power is transferred between the top and bottom halves of the circuit during this cycle. The top half of the circuit is that half that is connected directly or through other circuit elements to L3. The bottom half of the circuit is that half that is connected directly or through other circuit elements to L4. When the bottom bridge is operational it completes a cycle in which first S9 and S10 and then S11 and S12 are on. The result of this operation of the bottom bridge is to create a voltage across the windings of the transformer formed by the coupled inductors L3 and L4. If the voltage over C2 is less than the voltage of the constant voltage source Vdc1, power is transferred from Vdc1 to C2 through the rectifying action of the top diodes D9, D10, D11, and D12. If the voltage over C2 is larger than the voltage of the constant voltage source Vdc1, no power is transferred between the top and bottom halves of the circuit during this cycle. Both cycles together maintain a voltage over C2 that is substantially equal to the voltage of the constant voltage source Vdc1 with bi-directional power flow between C2 and Vdc1 in order to maintain this relationship. In FIG. 23A, the bridge formed by S1, S2, S3, and S4 maintain the desired clamping current through the inductors L1 and L2. The bridge does this by turning on S1 and S2 when current through L1 is too low, and S3 and S4 when the current is too high. In FIG. 23A, the amplitude of the current through the diode bridge between the nodes rf1 and rf2 is clamped to the current through L1.

TABLE 3

| Construct (if applicable) | Setting/Logic |
|---|---|
|  | .param Ilim = 5 |
|  | .model sw1 sw(Ron = 10m Roff = 1meg |
|  | Vt = 0 Vh = 0.1) |
|  | .model D D(Ron = 10m Roff = 100k |
|  | Vfwd = 0.5) |
|  | .tran 0 100u 0 1n |
| V21 | SINE(0 1 5meg) |
| V23 | SINE(0 1 2.5meg) |
| B21 | V = if(i(l1) < {Ilim}, 1, −1) |
| B22 | V = if(i(l1) > {Ilim}, 1, −1) |
| B23 | V = if(v(sw_c) > 0, v(sw_a), −1) |
| B24 | V = if(v(sw_c) > 0, −v(sw_a), −1) |
| B25 | V = if(v(sw_c) < 0, v(sw_a), −1) |
| B26 | V = if(v(sw_c) < 0, −v(sw_a), −1) |
| Vrf | Rser = 0.1; SINE(0 10 10meg) |

Figure 24:
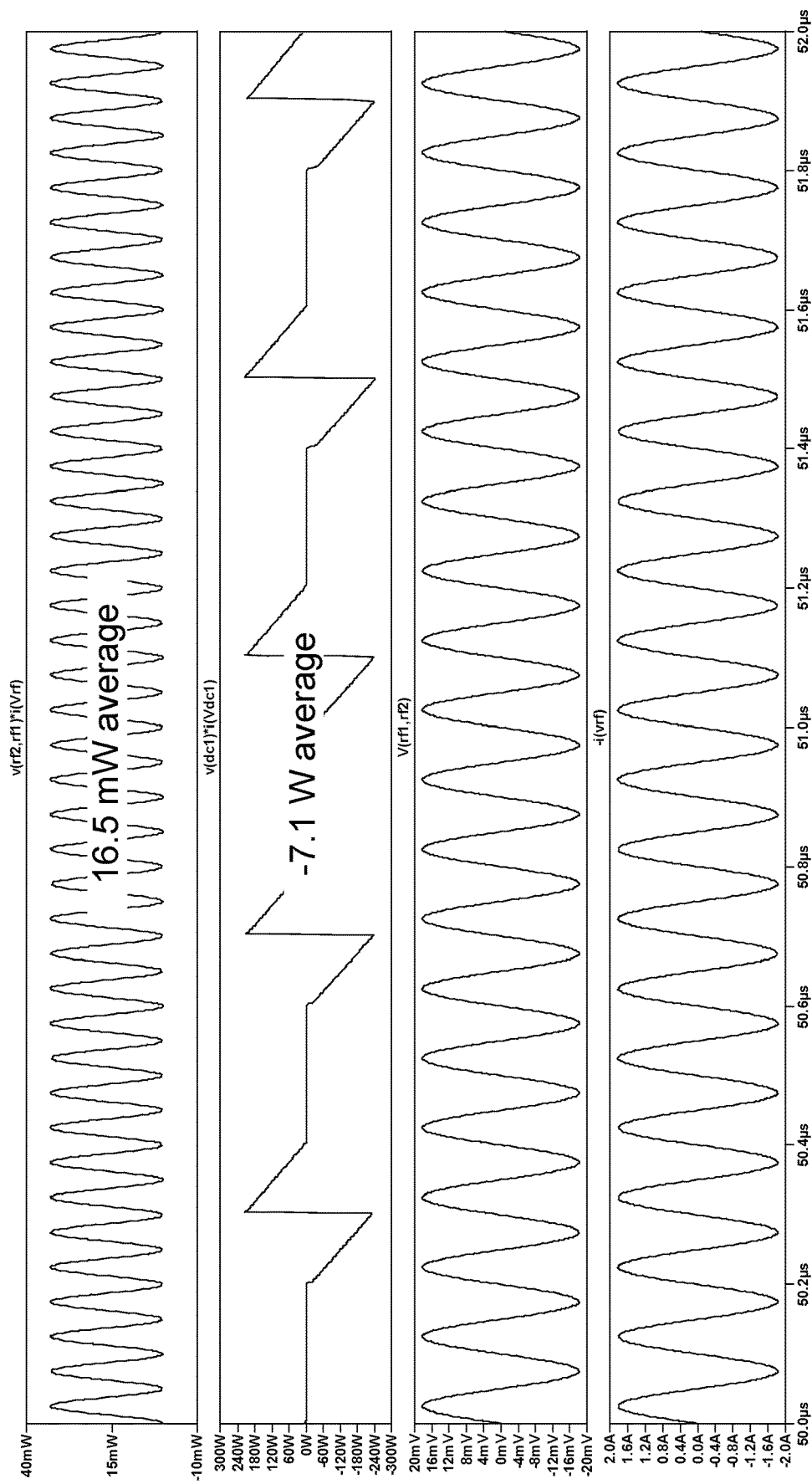
FIG. 24 includes graphs depicting power, voltage and current of the power recovery circuit of FIGS. 23A and 23B when the current to be clamped is less than the clamping current.

Referring next to FIG. 24, shown is the result of simulating the circuit of FIGS. 23A and 23B when the current to be clamped (supplied by Vrf in FIG. 23A) is less than the clamping current (5 A in this simulation). The bottom graph in FIG. 24 shows the peak current through the current clamp. The second from bottom graph in FIG. 24 shows that the voltage over the clamp is only 18 mV when the current through the clamp is 1.8 A. The third from bottom graph in FIG. 24 shows that the current clamp takes 7.1 W from the DC power sink due to losses in the non-ideal diodes. The top graph shows that almost no power is taken from the source connected to the current clamp (Vrf in FIG. 23).

Figure 25:
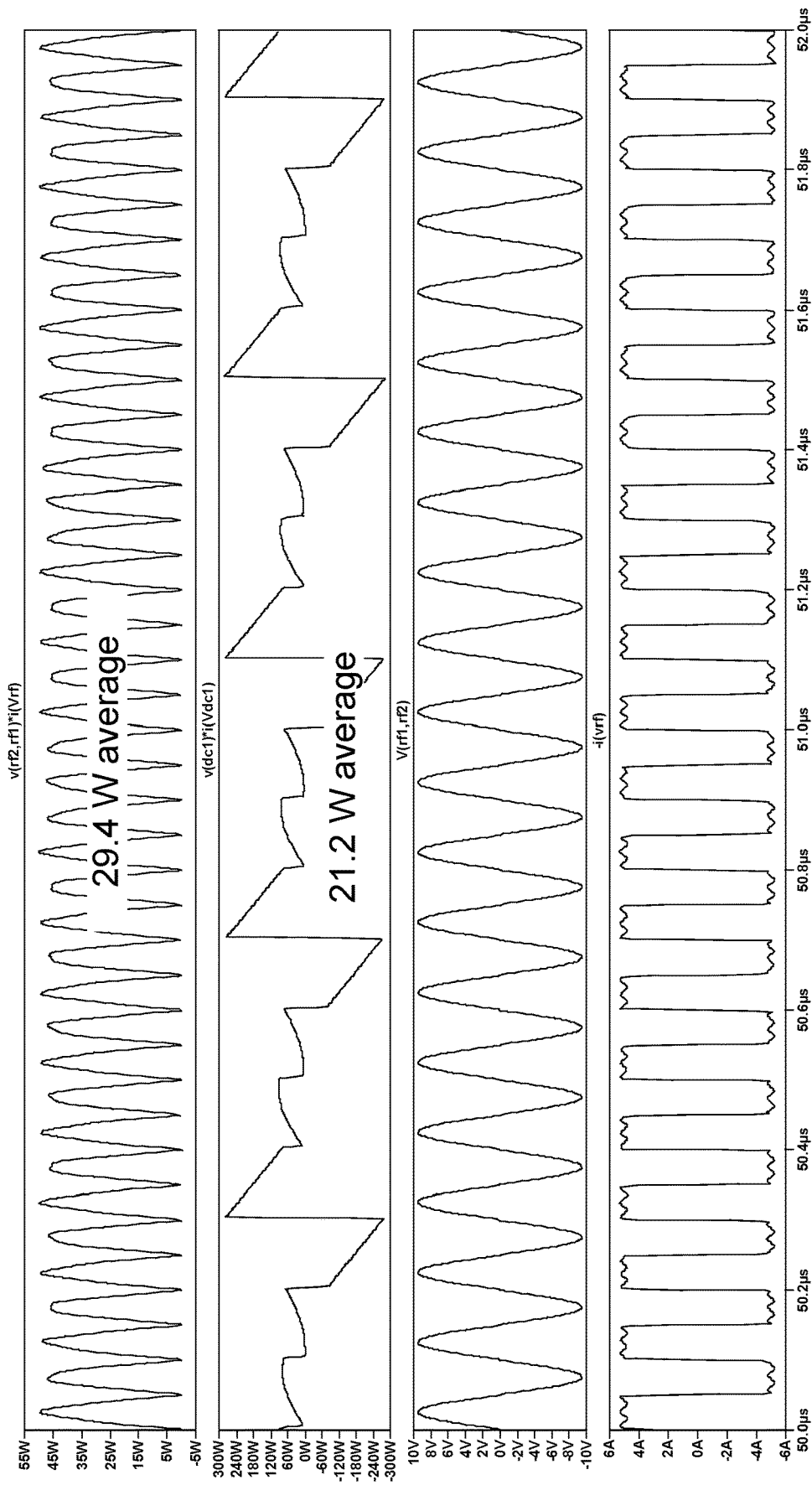
FIG. 25 includes graphs depicting power, voltage and current of the power recovery circuit of FIGS. 23A and 23B when the current to be clamped is larger than the clamping current.

Referring next to FIG. 25 shown is the result of simulating the circuit of FIGS. 23A and 23B when the current to be clamped (supplied by Vrf in FIG. 23A) is larger than the clamping current (5 A in this simulation). The bottom graph in FIG. 22 shows that the peak current through the current clamp is clamped at 5 A as intended. The second from bottom graphs shows the peak voltage over the current clamp that is 9.5 V in order to clamp the current at 5 A. The third from bottom graph shows that the voltage clamp recovers 21.2 W to the DC power sink. The top graph shows that 29.4 W is taken from the voltage source connected to the current clamp.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The various illustrative logical blocks, modules, and circuits described in connection with the embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

Figure 26:
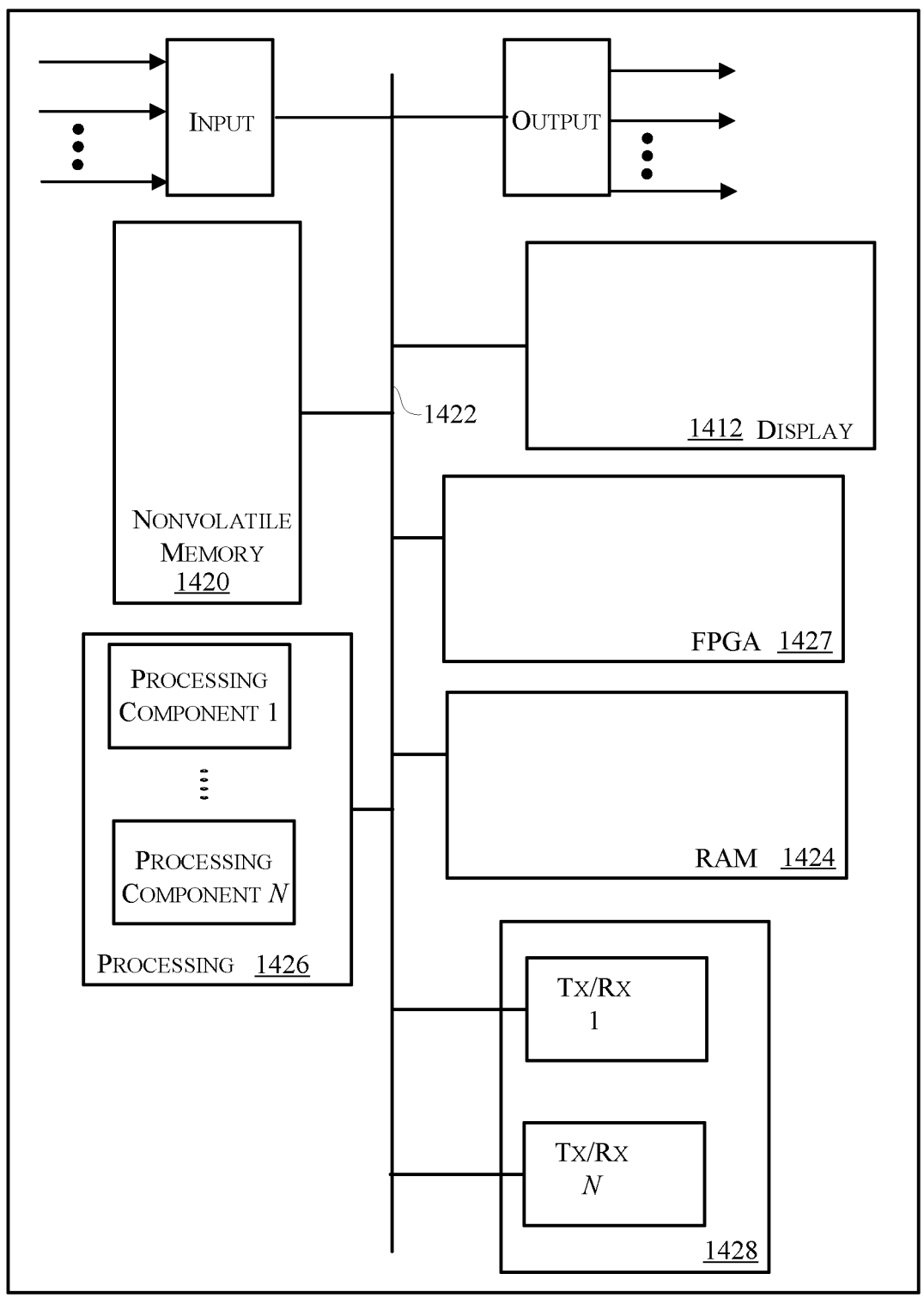
FIG. 26 is a block diagram depicting an example of computing components that may be utilized in connection with embodiments disclosed herein.

Referring to FIG. 26 shown is a block diagram depicting physical components that may be utilized to realize one or more aspects of the impedance networks disclosed herein. As shown, in this embodiment a display 1412 and nonvolatile memory 1420 are coupled to a bus 1422 that is also coupled to random access memory ("RAM") 1424, a processing portion (which includes N processing components) 1426, a field programmable gate array (FPGA) 1427, and a transceiver component 1428 that includes N transceivers. Although the components depicted in FIG. 26 represent physical components, FIG. 26 is not intended to be a detailed hardware diagram; thus, many of the components depicted in FIG. 26 may be realized by common constructs or distributed among additional physical components. Moreover, it is contemplated that other existing and yet-to-be developed physical components and architectures may be utilized to implement the functional components described with reference to FIG. 26.

A display 1412 generally operates to provide a user interface for a user, and in several implementations, the display 1412 is realized by a touchscreen display. For example, display 1412 can be used to control and interact with the components described herein. In general, the nonvolatile memory 1420 is non-transitory memory that functions to store (e.g., persistently store) data and machine readable (e.g., processor executable) code (including executable code that is associated with effectuating the methods described herein). In some embodiments, for example, the nonvolatile memory 1420 includes bootloader code, operating system code, file system code, and non-transitory processor-executable code to facilitate the execution of the methods described herein.

In many implementations, the nonvolatile memory 1420 is realized by flash memory (e.g., NAND or ONENAND memory), but it is contemplated that other memory types may be utilized as well. Although it may be possible to execute the code from the nonvolatile memory 1420, the executable code in the nonvolatile memory is typically loaded into RAM 1424 and executed by one or more of the N processing components in the processing portion 1426.

In operation, the N processing components in connection with RAM 1424 may generally operate to execute the instructions stored in nonvolatile memory 1420 to realize the functionality of the power recovery circuits described herein. For example, non-transitory processor-executable instructions to effectuate the methods described herein may be persistently stored in nonvolatile memory 1420 and executed by the N processing components in connection with RAM 1424. As one of ordinary skill in the art will appreciate, the processing portion 1426 may include a video processor, digital signal processor (DSP), graphics processing unit (GPU), and other processing components.

In addition, or in the alternative, the field programmable gate array (FPGA) 1427 may be configured to effectuate one or more aspects of the methodologies described herein. For example, non-transitory FPGA-configuration-instructions may be persistently stored in nonvolatile memory 1420 and accessed by the FPGA 1427 (e.g., during boot up) to configure the FPGA 1427.

The input component may operate to receive signals (e.g., from the voltage amplitude measurement circuit 442 and/or the current amplitude measurement circuit 440) that are indicative of voltage and/or current. The output component generally operates to provide one or more analog or digital signals (e.g., to prompt drive signals to the switch(es) in buck converters of the power recovery circuit 444) to effectuate operational aspects of the power recovery circuit.

The depicted transceiver component 1428 includes N transceiver chains, which may be used for communicating with external devices (e.g., external controllers) via wireless or wireline networks. Each of the N transceiver chains may represent a transceiver associated with a particular communication scheme (e.g., WiFi, Ethernet, Profibus, etc.).

As used herein, the recitation of "at least one of A, B and C" is intended to mean "either A, B, C or any combination of A, B and C." The previous description of the disclosed embodiments is provided to enable any person skilled in the art to make or use the present disclosure. Various modifications to these embodiments will be readily apparent to those skilled in the art, and the generic principles defined herein may be applied to other embodiments without departing from the spirit or scope of the disclosure. Thus, the present disclosure is not intended to be limited to the embodiments shown herein but is to be accorded the widest scope consistent with the principles and novel features disclosed herein.

What is claimed is:

1. An impedance network comprising:
   a transmission line comprising a plurality of sections;
   a plurality of clamping circuits, each of the plurality of clamping circuits configured to clamp at least one of voltage or current in at least one of the plurality of sections; and
   a power sink coupled to at least one of the plurality of clamping circuits, wherein the power sink comprises a power source comprising a circulator.

2. The impedance network of claim 1, wherein the power source comprises a DC bus.

3. The impedance network of claim 1, wherein one or more of the plurality of clamping circuits comprises a full diode bridge coupled to at least one of the plurality of sections.

4. The impedance network of claim 3, wherein at least one of the plurality of clamping circuits comprises a current clamping circuit comprising an inductor between nodes of the full diode bridge to enable current through the current clamping circuit to be controlled.

5. The impedance network of claim 4, wherein at least one of the plurality of clamping circuits comprises a voltage clamping circuit comprising a capacitor between nodes of the full diode bridge to enable a voltage at the voltage clamping circuit to be controlled.

6. An impedance circuit comprising:
   a transmission line;
   circuitry configured to clamp at least one of voltage or current in a plurality of sections of the transmission line;
   a circuit coupled to the circuitry to apply power to a terminal of the impedance circuit; and
   a circulator coupled to the terminal.

7. The impedance circuit of claim 6, comprising a measurement circuit coupled to the circuitry, wherein the measurement circuit is configured to measure one of voltage or current.

8. A power system comprising:
   a power source comprising a circulator; and
   an impedance network coupled to the power source, wherein the impedance network comprises:
   a transmission line coupled to the power source;
   circuitry configured to clamp at least one of voltage or current in a plurality of sections of the transmission line; and
   a circuit coupled to the circuitry to apply power to a terminal of the impedance network.

9. The power system of claim 8, wherein the power source comprises a generator coupled to the circulator.

10. The power system of claim 9, wherein the generator is configured to operate at frequencies less than 100 MHz.

11. The power system of claim 8, wherein the power source is coupled to the terminal.

12. The power system of claim 11, comprising:
    an inverter coupled between the circuit and an AC input of a generator to convert recovered DC power to AC power that is applied to the AC input of the generator.

13. The power system of claim 8, wherein the circuit is coupled to a DC bus of a generator to apply recovered DC power to the DC bus of the generator.

14. The impedance network of claim 1, comprising a load-terminal pair coupled to the transmission line, wherein the load-terminal pair is short circuited.

15. The impedance network of claim 1, comprising a load-terminal pair coupled to the transmission line, wherein the load-terminal pair is open circuited and configured with a total electrical delay equal to one quarter of a period of applied power.

16. The impedance circuit of claim 6, comprising a load-terminal pair coupled to the transmission line, wherein the load-terminal pair is short circuited.

17. The impedance circuit of claim 6, comprising a load-terminal pair coupled to the transmission line, wherein the load-terminal pair is open circuited and configured with a total electrical delay equal to one quarter of a period of applied power.

18. The power system of claim 8, comprising a load-terminal pair coupled to the transmission line, wherein the load-terminal pair is short circuited.

19. The power system of claim 8, comprising a load-terminal pair coupled to the transmission line, wherein the load-terminal pair is open circuited and configured with a total electrical delay equal to one quarter of a period of applied power.

* * * * *